(12) United States Patent
Fukuzawa et al.

(10) Patent No.: US 8,976,579 B2
(45) Date of Patent: Mar. 10, 2015

(54) MAGNETIC MEMORY ELEMENT, MAGNETIC MEMORY, AND MAGNETIC MEMORY DEVICE

(71) Applicant: Kabushiki Kaisha Toshiba, Tokyo (JP)

(72) Inventors: Hideaki Fukuzawa, Kanagawa-ken (JP); Yoshiaki Fukuzumi, Kanagawa-ken (JP); Hirofumi Morise, Kanagawa-ken (JP); Akira Kikitsu, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 138 days.

(21) Appl. No.: 13/757,981

(22) Filed: Feb. 4, 2013

(65) Prior Publication Data

US 2013/0250668 A1  Sep. 26, 2013

(30) Foreign Application Priority Data

Mar. 23, 2012  (JP) ................. 2012-067200

(51) Int. Cl.
| | |
|---|---|
| *G11C 11/00* | (2006.01) |
| *G11C 11/16* | (2006.01) |
| *G11C 11/14* | (2006.01) |
| *G11C 19/08* | (2006.01) |
| *G11C 21/00* | (2006.01) |

(52) U.S. Cl.
CPC .............. *G11C 11/161* (2013.01); *G11C 11/14* (2013.01); *G11C 19/0808* (2013.01); *G11C 21/00* (2013.01)
USPC .................... 365/158; 365/210.14; 365/225.5; 365/243; 365/55; 365/70

(58) Field of Classification Search
CPC ........ G11C 19/10; G11C 11/14; G11C 11/04; G11C 11/161; G11C 19/08; G11C 19/0808
USPC ............... 365/210.14, 225.5, 243, 55, 70, 74
See application file for complete search history.

(56) References Cited

U.S. PATENT DOCUMENTS

| | | |
|---|---|---|
| 6,834,005 B1 | 12/2004 | Parkin |
| 2006/0152324 A1* | 7/2006 | Haugs et al. .................. 336/210 |

(Continued)

FOREIGN PATENT DOCUMENTS

| | | |
|---|---|---|
| JP | 2006-504210 | 2/2006 |
| JP | 2010-67791 A | 3/2010 |
| JP | 2011-123943 A | 6/2011 |

OTHER PUBLICATIONS

Office Action issued May 20, 2014, in Japanese Patent Application No. 2012-067200 with English translation.

(Continued)

*Primary Examiner* — Thong Q Le
(74) *Attorney, Agent, or Firm* — Oblon, McClelland, Maier & Neustadt, L.L.P.

(57) ABSTRACT

According to one embodiment, a magnetic memory element includes: a magnetic wire, a stress application unit, and a recording/reproducing unit. The magnetic wire includes a plurality of domain walls and a plurality of magnetic domains separated by the domain walls. The magnetic wire is a closed loop. The stress application unit is configured to cause the domain walls to circle around along the closed loop a plurality of times by applying stress to the magnetic wire. The recording/reproducing unit is configured to write memory information by changing magnetizations of the circling magnetic domains as the domain walls circle around and to read the written memory information by detecting the magnetizations of the circling magnetic domains.

23 Claims, 21 Drawing Sheets

(56) References Cited

U.S. PATENT DOCUMENTS

2010/0061135 A1   3/2010   Nagasaka et al.
2012/0250398 A1   10/2012  Morise et al.
2012/0250406 A1   10/2012  Morise et al.

OTHER PUBLICATIONS

Japanese Office Action issued Sep. 2, 2014, in Japan Patent Application No. 2012-067200 (with English translation).

* cited by examiner

US 8,976,579 B2

MAGNETIC MEMORY ELEMENT, MAGNETIC MEMORY, AND MAGNETIC MEMORY DEVICE

CROSS-REFERENCE TO RELATED APPLICATIONS

This application is based upon and claims the benefit of priority from the prior Japanese Patent Application No. 2012-067200, filed on Mar. 23, 2012; the entire contents of which are incorporated herein by reference.

FIELD

Embodiments described herein relate generally to a magnetic memory element, a magnetic memory, and a magnetic memory device.

BACKGROUND

A spin shift register-type memory that uses domain walls has been proposed as a method for realizing higher memory capacities. In operations of such a memory, a domain wall memory that includes multiple domain walls is sequentially moved one bit at a time, that is, one domain wall at a time, in a magnetic wire. Advanced controls are necessary to accurately move the domain wall memory; and stable operations are difficult.

DETAILED DESCRIPTION

Figure 1:
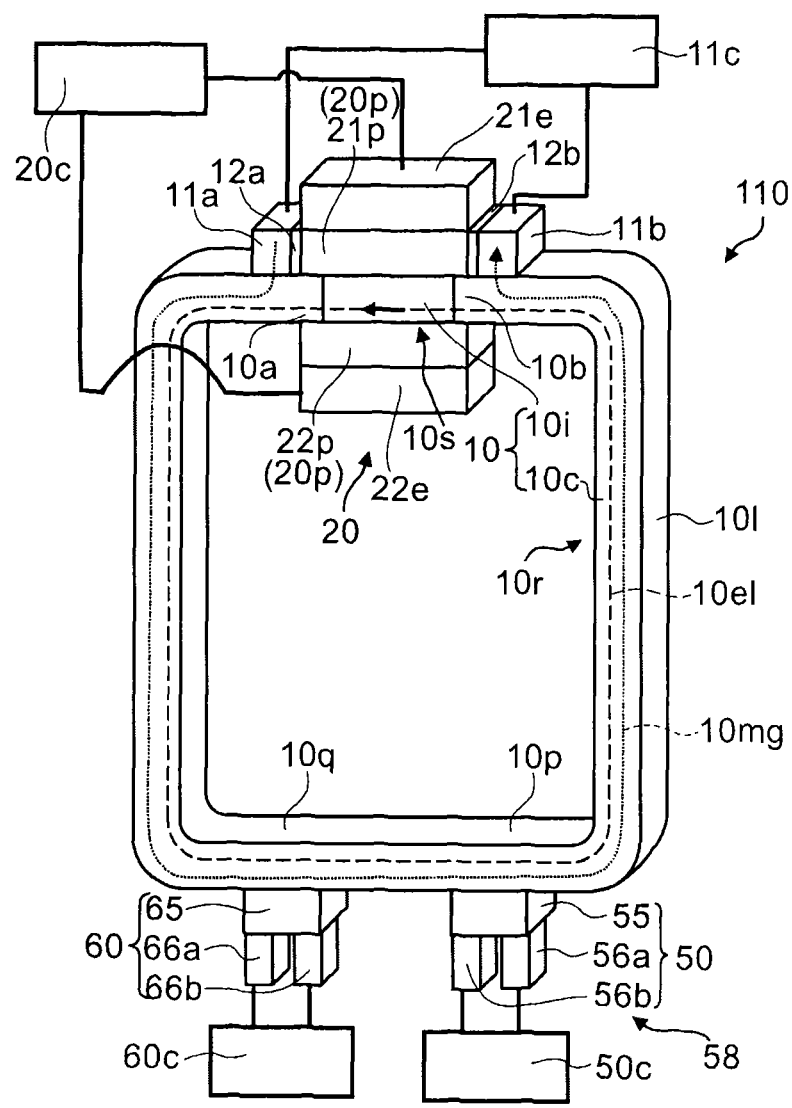
FIG. 1 is a schematic perspective view illustrating a configuration of a magnetic memory element according to a first embodiment.

In general, according to one embodiment, a magnetic memory element includes: a magnetic wire, a stress application unit, and a recording/reproducing unit. The magnetic wire includes a plurality of domain walls and a plurality of magnetic domains separated by the domain walls. The magnetic wire is a closed loop. The stress application unit is configured to cause the domain walls to circle around along the closed loop a plurality of times by applying stress to the magnetic wire. The recording/reproducing unit is configured to write memory information by changing magnetizations of the circling magnetic domains as the domain walls circle around and to read the written memory information by detecting the magnetizations of the circling magnetic domains.

In general, according to another embodiment, a magnetic memory element includes: a magnetic wire including a plurality of domain walls and a plurality of magnetic domains separated by the domain walls, the magnetic wire being a closed loop; a stress application unit configured to cause the domain walls to circle around along the closed loop a plurality of times by applying stress to the magnetic wire; a recording/reproducing unit configured to write memory information by changing magnetizations of the circling magnetic domains as the domain walls circle around and read the written memory information by detecting the magnetizations of the circling magnetic domains; a first electrode; and a second electrode, the magnetic wire including: a high conductivity magnetic portion having one end portion and one other end portion, the high conductivity magnetic portion extending along one portion of the closed loop between the one end portion and the one other end portion; and a low conductivity magnetic portion extending along one other portion of the closed loop to connect the one end portion to the one other end portion, a conductivity of the low conductivity magnetic portion being lower than a conductivity of the high conductivity magnetic portion, the stress being applied to the low conductivity magnetic portion by the stress application unit, the first electrode being electrically connected to the one end portion, the second electrode being electrically connected to the one other end portion, the one end portion having a portion overlaying the one other end portion, the low conductivity magnetic portion being disposed between the overlaying portion and the one other end portion.

In general, according to another embodiment, a magnetic memory device includes a plurality of magnetic memory elements, each of the magnetic memory elements including: a magnetic wire including a plurality of domain walls and a plurality of magnetic domains separated by the domain walls, the magnetic wire being a closed loop; a stress application unit configured to cause the domain walls to circle around along the closed loop a plurality of times by applying stress to the magnetic wire; and a recording/reproducing unit configured to write memory information by changing magnetizations of the circling magnetic domains as the domain walls circle around and to read the written memory information by detecting the magnetizations of the circling magnetic domains.

In general, according to another embodiment, a magnetic memory device includes a plurality of magnetic memory elements, each of the magnetic memory elements including: a magnetic wire including a plurality of domain walls and a plurality of magnetic domains separated by the domain walls, the magnetic wire being a closed loop; a stress application unit configured to cause the domain walls to circle around along the closed loop a plurality of times by applying stress to the magnetic wire; a recording/reproducing unit configured to write memory information by changing magnetizations of the circling magnetic domains as the domain walls circle around and read the written memory information by detecting the magnetizations of the circling magnetic domains; a first electrode; and a second electrode, the magnetic wire including: a high conductivity magnetic portion having one end portion and one other end portion, the high conductivity magnetic portion extending along one portion of the closed loop between the one end portion and the one other end portion; and a low conductivity magnetic portion extending along one other portion of the closed loop to connect the one end portion to the one other end portion, a conductivity of the low conductivity magnetic portion being lower than a conductivity of the high conductivity magnetic portion, the stress being applied to the low conductivity magnetic portion by the stress application unit, the first electrode being electrically connected to the one end portion, the second electrode being electrically connected to the one other end portion, the one end portion having a portion overlaying the one other end portion, the low conductivity magnetic portion being disposed between the overlaying portion and the one other end portion.

In general, according to another embodiment, a magnetic memory includes a plurality of the magnetic memory devices, each of the magnetic memory devices including a plurality of magnetic memory elements, each of the magnetic memory elements including: a magnetic wire including a plurality of domain walls and a plurality of magnetic domains separated by the domain walls, the magnetic wire being a closed loop; a stress application unit configured to cause the domain walls to circle around along the closed loop a plurality of times by applying stress to the magnetic wire; and a recording/reproducing unit configured to write memory information by changing magnetizations of the circling magnetic domains as the domain walls circle around and to read the written memory information by detecting the magnetizations of the circling magnetic domains.

In general, according to another embodiment, a magnetic memory includes a plurality of the magnetic memory devices, each of the magnetic memory devices including a plurality of magnetic memory elements, each of the magnetic memory elements including: a magnetic wire including a plurality of domain walls and a plurality of magnetic domains separated by the domain walls, the magnetic wire being a closed loop; a stress application unit configured to cause the domain walls to circle around along the closed loop a plurality of times by applying stress to the magnetic wire; a recording/reproducing unit configured to write memory information by changing magnetizations of the circling magnetic domains as the domain walls circle around and read the written memory information by detecting the magnetizations of the circling magnetic domains; a first electrode; and a second electrode, the magnetic wire including: a high conductivity magnetic portion having one end portion and one other end portion, the high conductivity magnetic portion extending along one portion of the closed loop between the one end portion and the one other end portion; and a low conductivity magnetic portion extending along one other portion of the closed loop to connect the one end portion to the one other end portion, a conductivity of the low conductivity magnetic portion being lower than a conductivity of the high conductivity magnetic portion, the stress being applied to the low conductivity magnetic portion by the stress application unit, the first electrode being electrically connected to the one end portion, the second electrode being electrically connected to the one other end portion, the one end portion having a portion overlaying the one other end portion, the low conductivity magnetic portion being disposed between the overlaying portion and the one other end portion.

Embodiments of the invention will now be described with reference to the drawings.

The drawings are schematic or conceptual; and the relationships between the thicknesses and the widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1 is a schematic perspective view illustrating the configuration of a magnetic memory element according to a first embodiment.

As illustrated in FIG. 1, the magnetic memory element 110 includes a magnetic wire 10, a first electrode 11*a*, a second electrode 11*b*, a stress application unit 20, and a recording/reproducing unit 58.

The magnetic wire 10 includes multiple domain walls and multiple magnetic domains. The magnetic domains are separated by the domain walls. The magnetic wire 10 is a closed loop 10*l*. For example, the cross-sectional configuration when the magnetic wire 10 is cut by a plane perpendicular to the extension direction of the magnetic wire 10 is a quadrilateral, a circle, or a flattened circle. The cross-sectional configuration is arbitrary. The magnetic wire 10 is the closed loop 10*l*; and the extension direction of the magnetic wire 10 may be defined at a local region of the magnetic wire 10. The extension direction of the magnetic wire 10 at the local region of the magnetic wire 10 is called the wire direction.

The closed loop 10*l* may be substantially parallel in one plane; or the closed loop 10*l* may be twisted. For example, the closed loop 10*l* may be bent; and one portion of the closed loop 10*l* may be in a plane that is different from that of another portion of the closed loop 10*l*.

In this example, the magnetic wire 10 includes a high conductivity magnetic portion 10*c* and a low conductivity magnetic portion 10i. The high conductivity magnetic portion 10c has one end portion 10a and one other end portion 10b. The high conductivity magnetic portion 10c extends along one portion 10r of the closed loop 10l between the one end portion 10a and the one other end portion 10b. The high conductivity magnetic portion 10c may include, for example, iron (Fe), cobalt (Co), nickel (Ni), an alloy including at least one selected from these elements, etc. Examples of the material of the high conductivity magnetic portion 10c are described below.

The first electrode 11a is electrically connected to the one end portion 10a of the magnetic wire 10. The second electrode 11b is electrically connected to the one other end portion 10b of the magnetic wire 10. For example, the first electrode 11a and the second electrode 11b are electrically connected to a spin injection circuit 11c. A current 10e1 supplied from the spin injection circuit 11c flows through the high conductivity magnetic portion 10c along the path of the loop via the first electrode 11a and the second electrode 11b.

The low conductivity magnetic portion 10i is provided along one other portion 10s of the closed loop 10l. The low conductivity magnetic portion 10i connects the one end portion 10a to the one other end portion 10b. Stress is applied to the low conductivity magnetic portion 10i by the stress application unit 20. The conductivity of the low conductivity magnetic portion 10i is lower than the conductivity of the high conductivity magnetic portion 10c. For example, the low conductivity magnetic portion 10i is substantially insulative. The low conductivity magnetic portion 10i may include, for example, an oxide, a nitride, an oxynitride, or the like including at least one element selected from Fe, Co, Ni, etc. Examples of the material of the low conductivity magnetic portion 10i are described below.

The low conductivity magnetic portion 10i is magnetically coupled to the high conductivity magnetic portion 10c. Thereby, the magnetic wire 10 forms a magnetic closed circuit.

The stress application unit 20 causes the domain walls of the magnetic wire 10 to circle around along the closed loop 10l by applying the stress to the magnetic wire 10. The magnetic domains circle around along the closed loop 10l as the domain walls circle around. The number of the circling is multiple. For example, the stress application unit 20 contacts the low conductivity magnetic portion 10i. An inverse magnetostrictive effect occurs due to the stress applied by the stress application unit 20. That is, the magnetization direction inside the magnetic wire changes due to the stress application. It is possible to move the domain walls through the magnetic wire by causing the magnetization direction change to occur along the interior of the magnetic wire. Because this is due to the stress application instead of a spin injection current, it is unnecessary for the magnetic wire to be a high conductivity magnetic layer in which a current flows; and driving is possible even in the case where the magnetic wire is a low conductivity magnetic layer. Thereby, the domain walls move in the low conductivity magnetic portion 10i.

In this example, the stress application unit 20 includes a first drive electrode 21e, a second drive electrode 22e, a first piezoelectric material layer 21p, and a second piezoelectric material layer 22p. The low conductivity magnetic portion 10i is disposed between the first drive electrode 21e and the second drive electrode 22e. In this example, the first drive electrode 21e opposes the second drive electrode 22e along a direction from the inside of the closed loop 10l toward the outside of the closed loop 10l.

The first piezoelectric material layer 21p is provided between the first drive electrode 21e and the low conductivity magnetic portion 10i. The second piezoelectric material layer 22p is provided between the second drive electrode 22e and the low conductivity magnetic portion 10i. To simplify the description, the first piezoelectric material layer 21p and the second piezoelectric material layer 22p are called a piezoelectric material layer 20p.

The piezoelectric material layer 20p (the first piezoelectric material layer 21p, the second piezoelectric material layer 22p, etc.) includes a piezoelectric material in which the crystal can elongate and contract when a voltage is applied. The piezoelectric material layer 20p may include, for example, PZT (Pb(Zr, Ti)O$_3$), AlN, PLZT (lead zirconate titanate), KNbO$_3$, ZnO, SiO$_2$, LiNbO$_3$, La$_3$Ga$_5$SiO$_{14}$, KNaC$_4$H$_4$O$_6$·4H$_2$O, Li$_2$B$_4$O$_7$, etc. The piezoelectric material layer 20p may include these piezoelectric materials as a base; and an additional element may be added to the base to adjust the characteristics. Also, the piezoelectric material layer 20p may have a stacked configuration in which multiple layers including these materials are stacked.

The first drive electrode 21e and the second drive electrode 22e are electrically connected to a stress application circuit 20c. The voltage supplied from the stress application circuit 20c is applied to the first piezoelectric material layer 21p and the second piezoelectric material layer 22p via the first drive electrode 21e and the second drive electrode 22e. Thereby, the stress is applied to the low conductivity magnetic portion 10i by the first piezoelectric material layer 21p and the second piezoelectric material layer 22p. Thereby, the magnetic domains (the domain walls) can move through the low conductivity magnetic portion 10i.

The domain walls move through the low conductivity magnetic portion 10i while maintaining the information of the domain walls of the high conductivity magnetic portion 10c. Thus, in the magnetic wire 10, a magnetic closed loop 10mg is formed; and the domain walls (the magnetic domains) move through the magnetic wire 10 along the magnetic closed loop 10mg.

The recording/reproducing unit 58 writes the memory information by changing the orientations of the magnetizations of the magnetic domains that circle around. The recording/reproducing unit 58 reads the written memory information by detecting the orientations of the magnetizations of the magnetic domains that circle around.

In this example, the recording/reproducing unit 58 includes a write unit 50 and a read-out unit 60.

The write unit 50 includes a write functional unit 55, a first write electrode 56a, and a second write electrode 56b. The write functional unit 55 opposes a portion of the magnetic wire 10 (in this example, a first portion 10p of the high conductivity magnetic portion 10c). One end of the first write electrode 56a and one end of the second write electrode 56b are connected to the write functional unit 55. One other end of the first write electrode 56a and one other end of the second write electrode 56b are electrically connected to a data write circuit 50c.

The read-out unit 60 includes a read-out functional unit 65, a first read-out electrode 66a, and a second read-out electrode 66b. The read-out functional unit 65 opposes another portion of the magnetic wire 10 (in this example, a second portion 10q of the high conductivity magnetic portion 10c). One end of the first read-out electrode 66a and one end of the second read-out electrode 66b are connected to the read-out functional unit 65. One other end of the first read-out electrode 66a and one other end of the second read-out electrode 66b are electrically connected to a data read-out circuit 60c.

In the specification of the application, the state of being electrically connected includes the state of being connected in direct contact, the state of being connected via a conductive member, the state of being connected via a switching element (e.g., a transistor and the like), etc.

In this example, an insulating layer 12a is provided between the first electrode 11a and the stress application unit 20. An insulating layer 12b is provided between the second electrode 11b and the stress application unit 20. Although not illustrated in FIG. 1, the magnetic wire 10, the stress application unit 20, etc., are buried in an insulating layer.

Figure 2:
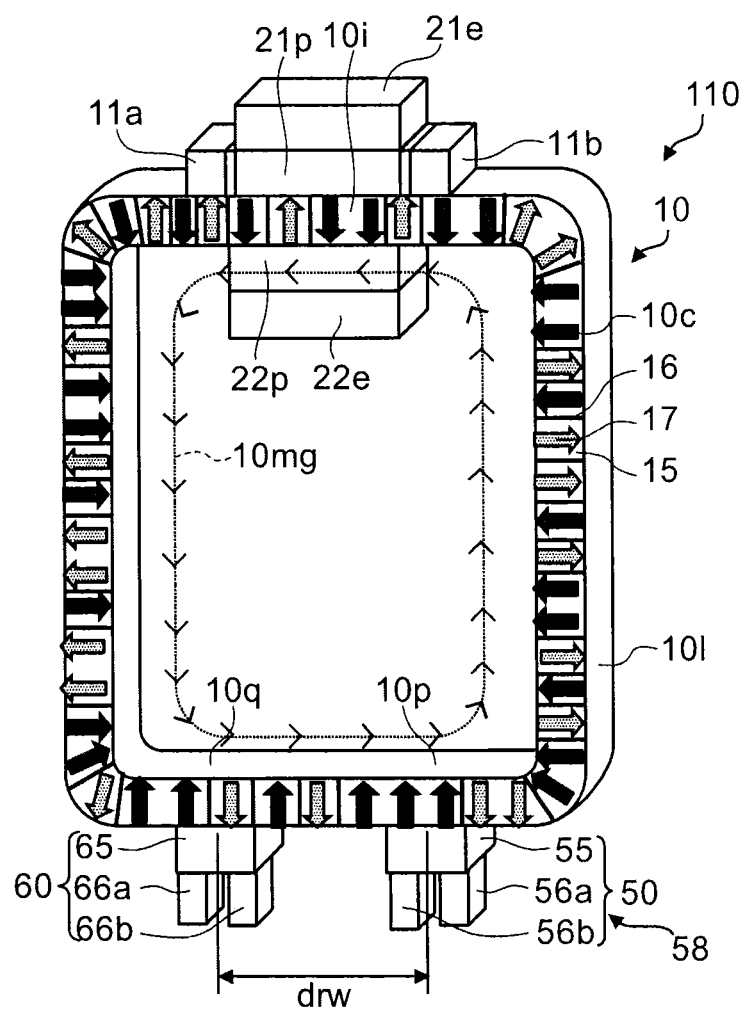
FIG. 2 to FIG. 4 are schematic perspective views illustrating the configuration and operations of the magnetic memory element according to the first embodiment.
Figure 3:
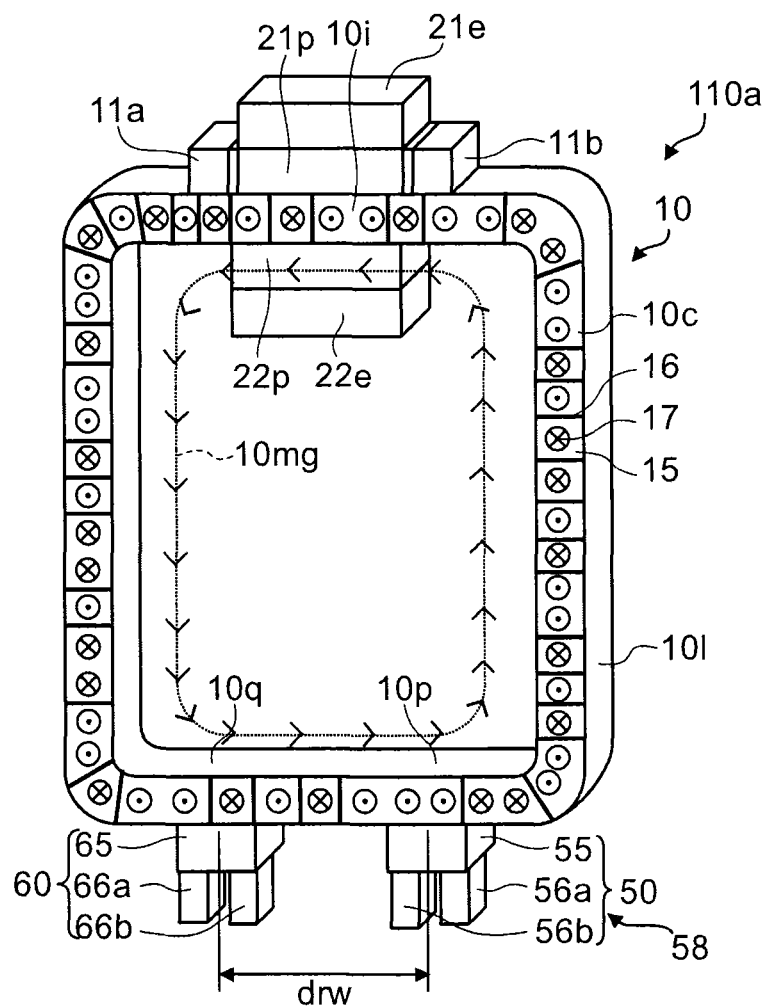
Figure 4:
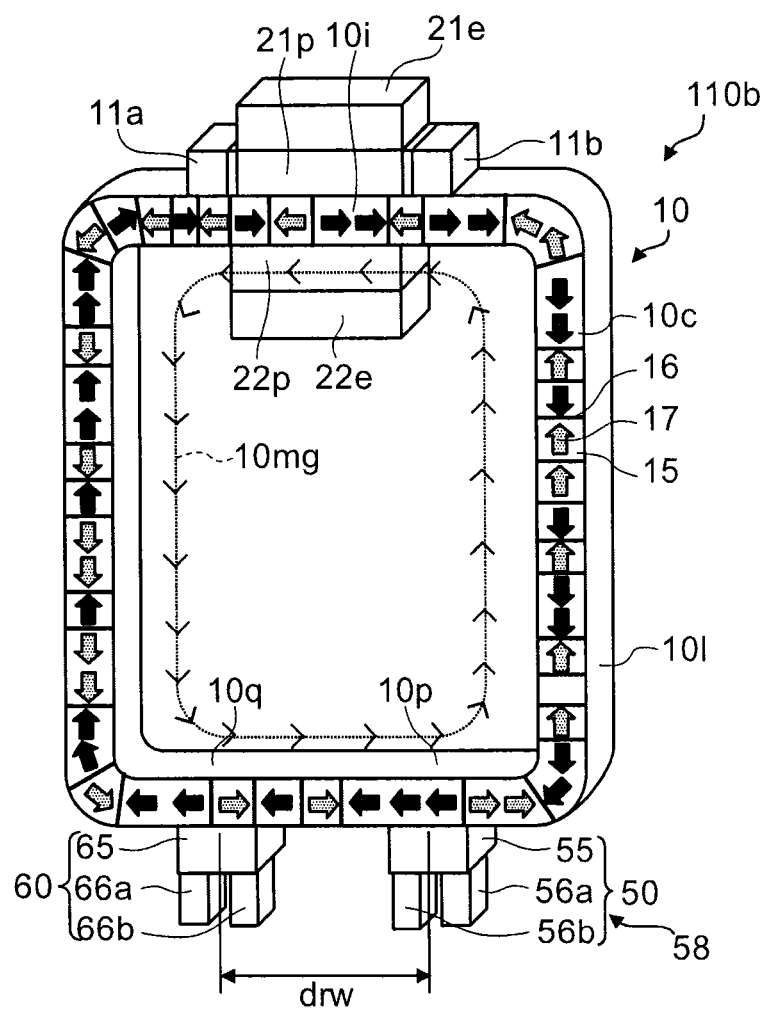

FIG. 2 to FIG. 4 are schematic perspective views illustrating the configuration and operations of the magnetic memory element according to the first embodiment.

As illustrated in FIG. 2 to FIG. 4, the magnetic wire 10 includes multiple domain walls 16 and multiple magnetic domains 15. The multiple magnetic domains 15 are partitioned by the domain walls 16. The direction of a magnetization 17 is substantially constant inside one magnetic domain 15. The region between two magnetic domains 15 corresponds to the domain wall 16.

For example, in the example illustrated in FIG. 2, the direction of the magnetization 17 is substantially perpendicular to the wire direction. The magnetization 17 is in the direction from the inside toward the outside of the closed loop 10l or in the direction from the outside toward the inside of the closed loop 10l.

For example, in a magnetic memory element 110a illustrated in FIG. 3, the direction of the magnetization 17 is substantially perpendicular to the wire direction; and the direction of the magnetization 17 is in two directions (mutually reverse directions) that are substantially perpendicular to a plane including the closed loop 10l.

In a magnetic memory device 110b illustrated in FIG. 4, the direction of the magnetization 17 is substantially parallel to the wire direction.

Thus, the direction of the magnetization 17 is arbitrary. However, a configuration in which the magnetization direction is perpendicular to the wire direction is more desirable. This is because it is possible to reduce the power consumption for driving the domain walls because the energy for moving the domain walls decreases.

For example, in the case where the magnetization direction is perpendicular to the wire direction and perpendicular to the plane in which the closed loop 10l is formed, the magnetization direction is in the same direction or in the reverse direction at any location inside the magnetic wire 10. Such a configuration is favorable because the effect of the spin-polarized current is uniform inside the wire.

At the domain wall 16, for example, the direction of the magnetization 17 changes continuously along the wire direction. The domain wall 16 has a finite width determined by the anisotropic energy, the exchange stiffness, etc., of the magnetic body. In the magnetic memory element 110, the directions of the magnetizations 17 of the multiple magnetic domains 15 correspond to bit data of 0 or 1. For example, the amount of the memory information provided in one magnetic wire 10 is not less than 100 bits and not more than 1,000,000 (1 M) bits. The embodiment is not limited thereto; and the amount of the memory information is arbitrary. The memory information may include address signal information of the relative positional information of the magnetic wire 10. An example including the address signal information has the advantage that data that is once stored does not need to be moved to a prescribed position prior to or after the read/write operation.

In the writing operation, a current is caused to flow in the high conductivity magnetic portion 10c via the first electrode 11a and the second electrode 11b. For example, this current is a continuous current. In other words, the current that is used is not a pulse current (an intermittent current) such as that which moves a memory unit one bit at a time. Due to this current, a spin-polarized electron current occurs inside the magnetic wire 10; and the magnetic domains 15 (and the domain walls 16) move along the wire direction through the high conductivity magnetic portion 10c due to this effect. Accordingly, the movement direction of the magnetic domains 15 and the domain walls 16 is the reverse of the direction in which the current flows (the same as the direction in which the electron current flows). In the embodiment, the current caused to flow in the magnetic wire 10 may flow in two directions or may flow in one direction. The reliability of the shift movement can be increased in the configuration in which the current flows in one direction.

On the other hand, the stress is applied to the low conductivity magnetic portion 10i by the stress application unit 20. Strain occurs in the low conductivity magnetic portion 10i due to the stress. Then, due to the strain that occurs, the magnetization changes at the section where the strain is applied due to the inverse magnetostrictive effect of the magnetic material of the magnetic wire. It is possible to cause the domain wall movement along the magnetic wire by performing the driving along the magnetic wire by the strain application. In other words, the domain walls 16 (the magnetic domains 15) inside the low conductivity magnetic portion 10i move along the wire direction through the low conductivity magnetic portion 10i. The stress application unit 20 applies the stress to the low conductivity magnetic portion 10i such that this movement direction matches the movement direction of the domain walls 16 (the magnetic domains 15) in the high conductivity magnetic portion 10c. Thereby, the domain walls 16 (the magnetic domains 15) circle around along the magnetic closed loop 10mg formed from the high conductivity magnetic portion 10c and the low conductivity magnetic portion 10i. This circling is continuous and is performed multiple times.

For example, the write unit 50 writes the memory information by changing the orientations of the magnetizations 17 of the magnetic domains 15 that circle around at the first portion 10p of the magnetic wire 10. The read-out unit 60 reads the memory information that is written by detecting the orientations of the magnetizations 17 of the magnetic domains 15 that circle around at the second portion 10q.

In the magnetic memory element 110, the domain walls 16 (the magnetic domains 15) circle around continuously. In the case where the domain walls 16 (the magnetic domains 15) are moved for each memory bit, extremely advanced controls are necessary for stable operations. The embodiment implements a device operation that is completely different from a device operation in which a domain wall memory is moved one bit at a time, that is, one domain wall at a time. In the embodiment, an operation is performed that is completely different from an operation that reads by a shift operation one bit at a time. In the embodiment, for example, an advanced bit unit movement control in which a shift register operation of the domain walls is performed one bit at a time is unnecessary. Thereby, due to the simple operation that causes continuous movement, a magnetic memory element in which stable operations are possible can be provided. Because the magnetic wire 10 has a closed loop configuration, the buffer region, etc., can be eliminated; and the storage capacity can be increased. Also, the reliability of the operations can be increased in the configuration in which the current flows along one direction of the closed loop 10l.

In the writing operation and the read-out operation of the magnetic memory element 110, the current that drives the domain walls 16 is caused to flow continuously in the high conductivity magnetic portion 10c of the magnetic wire 10. Simultaneously, the stress that drives the domain walls 16 is applied to the low conductivity magnetic portion 10i of the magnetic wire 10 by the stress application unit 20 by applying the voltage to the electrodes of the stress application unit 20. Thereby, a state is formed in which the domain walls 16 have a continuous circling movement through the magnetic wire 10. The recording/reproducing unit 58 writes and reads the memory information to and from the magnetic wire 10 in the state of the circling movement.

For example, the recording/reproducing unit 58 continuously reproduces the information of the moving domain walls 16 in the state in which the multiple domain walls 16 continuously move through the magnetic closed circuit (the magnetic wire 10). The recording/reproducing unit 58 writes the magnetic information (the memory information) to the necessary position of the moving domain walls 16 in the state in which the multiple domain walls 16 continuously move through the magnetic closed circuit.

The recording/reproducing unit 58 may be formed of one element that performs the writing operation and the read-out operation. As recited above, the recording/reproducing unit 58 may include the write unit 50 that performs the writing at the first portion 10p and the read-out unit 60 that performs the reading at the second portion 10q. In such a case, the time for one magnetic domain 15 to reach the position of the write unit 50 after being read by the read-out unit 60 is known from the velocity of the movement of the domain walls 16 and the shift of the position between the first portion 10p and the second portion 10q which is pre-designed. The writing may be performed after this time.

For example, as illustrated in FIG. 2, the distance from the position of the closed loop 10l at the second portion 10q to the position of the closed loop 10l at the first portion 10p along the closed loop 10l along the direction of the movement of the domain walls 16 is taken as drw (meters). The velocity of the movement of the magnetic domains 15 along the closed loop 10l is taken as v (meters/second). The write unit 50 can implement the writing operation t=drw/v (seconds) after the read-out unit 60 implements the read-out operation.

For example, a verify operation that detects whether or not the desired information is written may be implemented by the read-out unit 60 reading the information after the write unit 50 writes the memory information to the magnetic wire 10. The writing operation is performed again in the case where it is determined in the verify operation that the desired memory state is not formed. At this time, for example, it is easier to perform the writing of the memory information reliably by performing the writing operation after a prescribed amount of time such as that recited above has elapsed after the read-out operation for the verification.

Figure 5A:
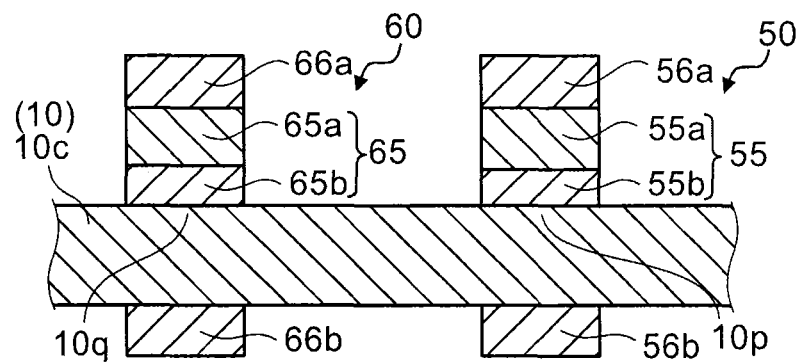
FIG. 5A and FIG. 5B are schematic perspective views illustrating configurations of the magnetic memory element according to the first embodiment.
Figure 5B:
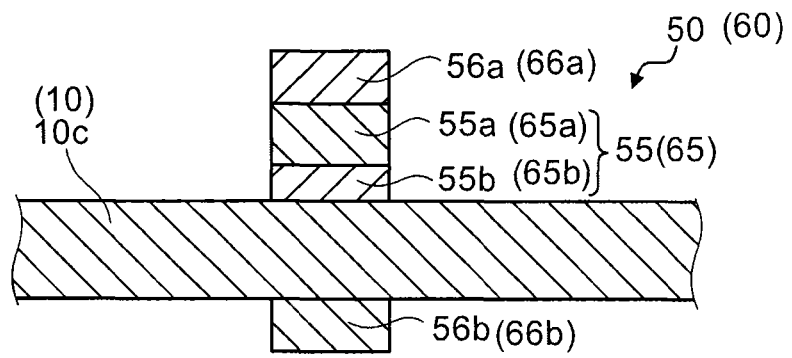

FIG. 5A and FIG. 5B are schematic perspective views illustrating configurations of the magnetic memory element according to the first embodiment.

In the write unit 50 as illustrated in FIG. 5A, the magnetic wire 10 (in this example, the high conductivity magnetic portion 10c) is disposed between the first write electrode 56a and the second write electrode 56b. For example, the write functional unit 55 is disposed between the first write electrode 56a and the magnetic wire 10. For example, the write functional unit 55 includes a fixed magnetic layer 55a and a nonmagnetic layer 55b. In this example, the nonmagnetic layer 55b is disposed between the fixed magnetic layer 55a and the magnetic wire 10. The magnetization of the fixed magnetic layer 55a is oriented in a designated direction.

In the writing operation, a current is caused to flow between the first write electrode 56a and the second write electrode 56b. In other words, an electron current is caused to flow. The orientation of the flow of the electron current is the opposite direction with respect to the orientation of the flow of the current.

In the case where the electron current flows from the first write electrode 56a toward the second write electrode 56b, the electrons passing through the fixed magnetic layer 55a are spin-polarized. The spin-polarized electrons pass through the nonmagnetic layer 55b to reach the first portion 10p of the magnetic wire 10. The spin-polarized electrons having a spin of the same direction as the direction of the magnetization of the first portion 10p pass through the first portion 10p. The spin torque of the spin-polarized electrons having a spin of the reverse direction with respect to the magnetization of the first portion 10p acts on the magnetization of the first portion 10p such that the direction of the magnetization of the first portion 10p is oriented in the same direction as the magnetization of the fixed magnetic layer 55a. Thereby, the magnetization of the first portion 10p is in the same direction as the magnetization of the fixed magnetic layer 55a.

In the case where the electron current flows from the second write electrode 56b toward the first write electrode 56a, the electrons passing through the first portion 10p are spin-polarized. The spin-polarized electrons flow in the fixed magnetic layer 55a via the nonmagnetic layer 55b. The electrons having a spin of the same direction as the magnetization of the fixed magnetic layer 55a pass through the fixed magnetic layer 55a. The electrons having a spin of the reverse direction with respect to the magnetization of the fixed magnetic layer 55a are reflected by the interface between the nonmagnetic layer 55b and the fixed magnetic layer 55a and flow into the first portion 10p. The spin torque of the spin-polarized electrons having the spin of the reverse direction with respect to the magnetization of the fixed magnetic layer 55a acts on the magnetization of the first portion 10p such that the direction of the magnetization of the first portion 10p is oriented in the reverse direction with respect to the magnetization of the fixed magnetic layer 55a. Thereby, the magnetization of the first portion 10p is the reverse direction with respect to the magnetization of the fixed magnetic layer 55a.

Thus, for example, the directions of the magnetizations 17 of the magnetic domains 15 of the magnetic wire 10 can be controlled to be in the desired direction by the direction of the current (the electron current) flowing between the first write electrode 56a and the second write electrode 56b.

In the read-out unit 60 as illustrated in FIG. 5A, the magnetic wire 10 (in this example, the high conductivity magnetic portion 10c) is disposed between the first read-out electrode 66a and the second read-out electrode 66b. For example, the read-out functional unit 65 is disposed between the first read-out electrode 66a and the magnetic wire 10. For example, the read-out functional unit 65 includes a magnetization reference layer 65a and a nonmagnetic layer 65b. In this example, the nonmagnetic layer 65b is disposed between the magnetization reference layer 65a and the magnetic wire 10. The magnetization of the magnetization reference layer 65a is oriented in a designated direction.

In the read-out operation, a current is caused to flow between the first read-out electrode 66a and the second read-out electrode 66b. For example, a voltage is applied. The resistance between the first read-out electrode 66a and the second read-out electrode 66b changes due to the relative angle between the direction of the magnetization 17 of the magnetic domain 15 of the magnetic wire 10 (in this example, the high conductivity magnetic portion 10c) and the direction of the magnetization of the magnetization reference layer 65a. For example, the resistance is low when the direction of the magnetization 17 of the magnetic domain 15 of the magnetic wire 10 (in this example, the high conductivity magnetic portion 10c) is parallel to the direction of the magnetization of the magnetization reference layer 65a. The resistance is high when antiparallel.

As illustrated in FIG. 5B, an element may be used as both the write unit 50 and the read-out unit 60. In other words, one element may operate as the write unit 50 and operate as the read-out unit 60.

An example of the configuration of the high conductivity magnetic portion 10c of the magnetic wire 10 will now be described. As described below, there are cases where the magnetic wire 10 is formed of the high conductivity magnetic portion 10c without including the low conductivity magnetic portion 10i. In such a case, the following description relating to the high conductivity magnetic portion 10c is applicable to the magnetic wire 10.

For example, the high conductivity magnetic portion 10c is formed of a single metal, an alloy, etc., that includes at least one element selected from the group consisting of iron (Fe), cobalt (Co), nickel (Ni), manganese (Mn), and chrome (Cr). The high conductivity magnetic portion 10c may include a magnetic alloy that includes at least one element selected from the group recited above. For example, permalloy (a NiFe alloy), a CoFe alloy, etc., are examples of materials that may be used as the high conductivity magnetic portion 10c.

The high conductivity magnetic portion 10c may include a magnetic material having perpendicular magnetic anisotropy and a large uniaxial anisotropy constant Ku if necessary. In the case where a material having a large anisotropy constant Ku is used, the domain wall width is narrow when a magnetic field or a current is not applied. In the case where the material having the large anisotropy constant Ku is used as the high conductivity magnetic portion 10c in the embodiment, an effect is easy to obtain in which the domain wall width enlarges when the magnetic field is applied. Examples of such a material include an alloy that includes at least one element selected from the group consisting of Fe, Co, Ni, Mn, and Cr and at least one element selected from the group consisting of Pt, Pd, Ir, Ru, and Rh. The value of the uniaxial anisotropy constant can be adjusted by the composition of the magnetic material included in the high conductivity magnetic portion 10c, the crystalline order due to the heat treatment, etc.

The high conductivity magnetic portion 10c may include a magnetic material that has perpendicular magnetic anisotropy and a hcp (hexagonal close-packed) crystal structure. For example, a material including a metal having a main component of Co may be used as the high conductivity magnetic portion 10c; and another metal having a hcp structure such as a hard magnetic material of CoPt, CoPt with an additional element added, etc., may be used. Also, a hard magnetic material of FePt, FePt with an additional element added, etc., may be used.

As described above, the direction of the magnetization 17 of the high conductivity magnetic portion 10c (the magnetic wire 10) may be substantially perpendicular to the wire direction and may be substantially parallel to the wire direction. In the case of being substantially perpendicular, the current value necessary to move the domain walls 16 can be reduced.

The high conductivity magnetic portion 10c may include Co, a CoPt alloy, a CoCrPt alloy, etc. In these materials, the magnetic anisotropy is large; and the easy axis of the magnetic anisotropy is in the film surface. These materials are metal crystals in which the hcp c axis is in the film surface.

The materials recited above may include materials to which an additional element is added.

The high conductivity magnetic portion 10c may include a Co layer, a CoPt layer, an FePt layer, a Co/Ni stacked film, a TbFe layer, etc. The CoPt may be an alloy. In these materials, the hcp c axis is oriented in the film surface perpendicular direction. In the case of the TbFe layer, the TbFe layer has perpendicular anisotropy in the case where the Tb is not less than 20 atomic % and not more than 40 atomic %. The materials recited above may include materials to which an additional element is added.

The high conductivity magnetic portion 10c may include a material having perpendicular magnetic anisotropy that is an alloy of a rare-earth element and an iron group transition element. For example, the high conductivity magnetic portion 10c may include at least one selected from GdFe, GdCo, GdFeCo, TbFe, TbCo, TbFeCo, GdTbFe, GdTbCo, DyFe, DyCo, and DyFeCo.

The high conductivity magnetic portion 10c may include a material in which at least one nonmagnetic element selected from Ag, Cu, Au, Al, Mg, Si, Bi, Ta, B, C, O, N, Pd, Pt, Zr, Ir, W, Mo, Nb, and H is added to the materials recited above. The magnetic property can be adjusted by adding these nonmagnetic elements. Various properties such as the crystallinity, the mechanical properties, the chemical properties, etc., can be adjusted by the added element.

In the case where the length in the wire direction (the length along the closed loop 10l) of the magnetic wire 10 (the high conductivity magnetic portion 10c) is long, the magnetic wire 10 (the high conductivity magnetic portion 10c) may include many magnetic domains 15. In the case where the total length is excessively long, the electrical resistance of the entire magnetic wire 10 increases. For example, the length of the magnetic wire 10 (the high conductivity magnetic portion 10c) in the wire direction is not less than 100 nm and not more than 10 micrometers (μm).

The thickness (the diameter or the length of one side) of the cross section of the magnetic wire 10 when cut by a plane perpendicular to the wire direction is, for example, not less than 2 nanometers (nm) and not more than 300 nm. Thereby, a magnetization distribution does not occur easily in the cross section perpendicular to the wire direction.

It is favorable for the closed loop 10l of the magnetic wire 10 to have a smooth curved configuration. Thereby, the domain walls 16 (the magnetic domains 15) can move smoothly through the magnetic wire 10.

For example, the low conductivity magnetic portion 10i may include at least one selected from a magnetic oxide, a magnetic nitride, and a magnetic oxynitride. The iron oxide may include $Fe_3O_4$, $\gamma\text{-}Fe_2O_3$, $\alpha\text{-}Fe_2O_3$, these iron oxides with an additional element and/or an iron nitride added, etc. $CoFe_2O_4$, $NiFe_2O_4$, $MnFe_2O_4$, $CrFe_2O_4$, etc., also may be included. A material having a spinel crystal structure is practically easy to use as the magnetic oxide because many materials having spinel crystal structures have high Curie temperatures. Such materials also are easy to use because the magnetostriction constant can be changed by changing the additional element.

The low conductivity magnetic portion 10i may include at least one selected from an oxide, a nitride, and an oxynitride, where the oxide includes at least one selected from Fe, Co, and Ni, the nitride includes at least one selected from Fe, Co, and Ni, and the oxynitride includes at least one selected from Fe, Co, and Ni. For example, the low conductivity magnetic portion 10i may include at least one selected from an oxide, a nitride, and an oxynitride of the material included in the high conductivity magnetic portion 10c. Thereby, it is easier for the domain walls to be moved by the stress application because a magnetic material having a large magnetostriction can be realized while using an insulator material such that a current does not flow through the magnetic wire.

It is favorable for the absolute value of the magnetostriction constant (λs) of the low conductivity magnetic portion 10i to be not less than $10^{-5}$. Thereby, the strain occurs efficiently in the low conductivity magnetic portion 10i due to the stress that is applied by the stress application unit 20; and the magnetic domains 15 can move efficiently in the low conductivity magnetic portion 10i. The magnetostriction constant (λs) is the magnitude of the shape deformation when the ferromagnetic layer is saturation-magnetized in some direction by applying an external magnetic field. The magnetostriction constant λs is ΔL/L, where the layer has the length L in the state in which there is no external magnetic field and changes by ΔL when the external magnetic field is applied. Although this change amount changes with the size of the external magnetic field, the magnetostriction constant λs is ΔL/L for the state in which the magnetization is saturated by applying a sufficient external magnetic field. It is favorable for the absolute value of the magnetostriction constant of the low conductivity magnetic portion 10i to be not more than $10^{-2}$. This value is the upper limit of the known value of the material for which the magnetostrictive effect occurs.

The magnetic wire 10 includes a magnetic material. A wire served as the magnetic wire 10 is formed of a magnetic material. Further, the magnetic wire 10 may includes a nonmagnetic material as long as the magnetic wire 10 forms a magnetic closed circuit. For example, the magnetic wire 10 includes a wire made of a magnetic material and a thin nonmagnetic layer which is inserted between one end of the wire and other end of the wire. Thus, the one end of the wire served as the magnetic wire 10 may be apart from the other end of the wire in a short distance of a thickness of the thin nonmagnetic layer. The thickness of the thin nonmagnetic layer is preferably not more than 2 nm, for example. Thereby using a thin nonmagnetic layer with such a thin thickness, the magnetic wire 10 easily forms a magnetic closed circuit.

Figure 6:
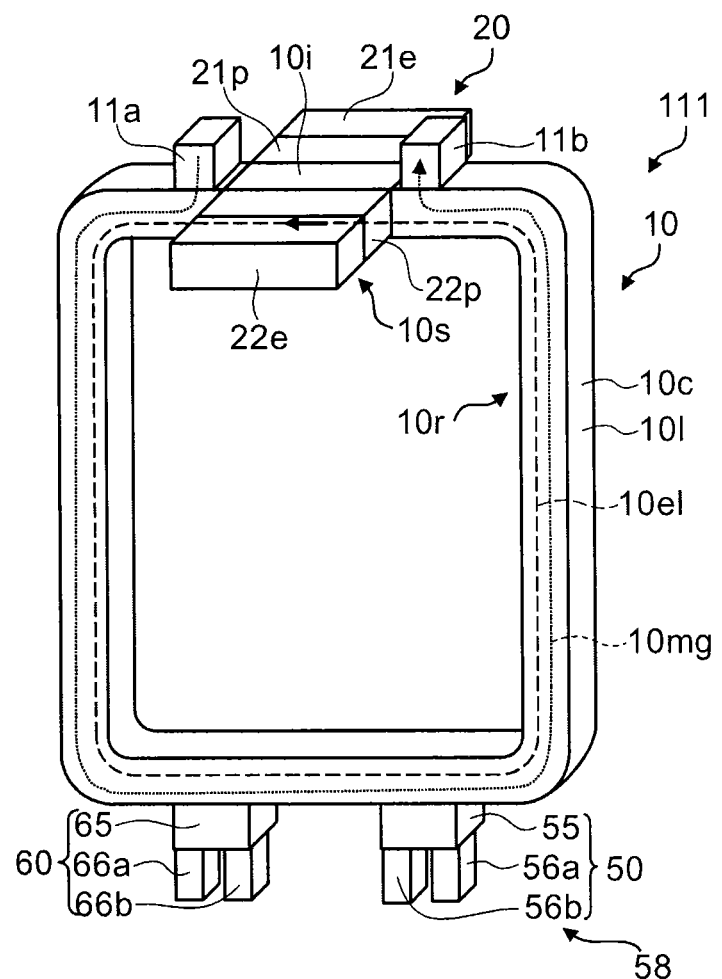
FIG. 6 is a schematic perspective view illustrating a configuration of another magnetic memory element according to the first embodiment.

FIG. 6 is a schematic perspective view illustrating the configuration of another magnetic memory element according to the first embodiment.

In the magnetic memory element 111 according to the embodiment as illustrated in FIG. 6, the first drive electrode 21e of the stress application unit 20 opposes the second drive electrode 22e along a direction perpendicular to the plane in which the magnetic wire 10 extends. Otherwise, the configuration is similar to that of the magnetic memory element 110, and a description is therefore omitted.

Figure 7:
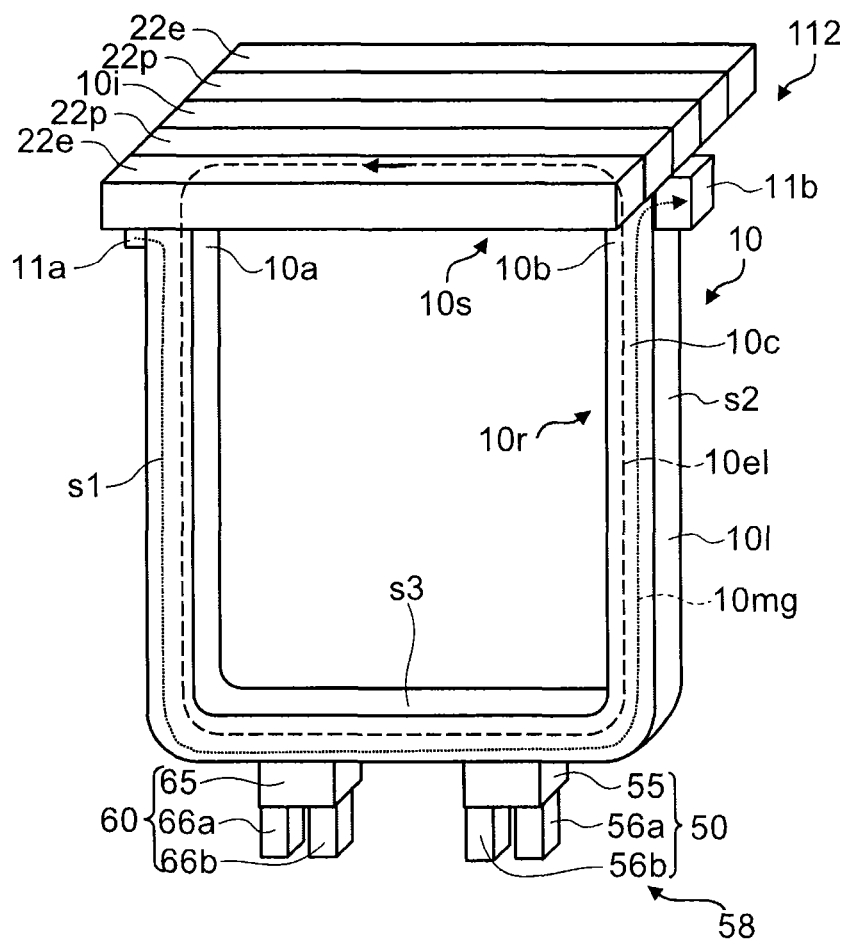
FIG. 7 is a schematic perspective view illustrating a configuration of another magnetic memory element according to the first embodiment.

FIG. 7 is a schematic perspective view illustrating the configuration of another magnetic memory element according to the first embodiment.

In the magnetic memory element 112 according to the embodiment as illustrated in FIG. 7, the closed loop 10l of the magnetic wire 10 has a rectangular configuration with rounded corners. The high conductivity magnetic portion 10c includes a first side portion 51 having a portion extending along a first direction, a second side portion s2 separated from the first side portion s1 and having a portion extending along the first direction, and a third side portion s3 having a portion extending in a second direction perpendicular to the first direction to connect one end of the first side portion 51 to one end of the second side portion s2. The configuration of the linking portion between the first side portion s1 and the third side portion s3 is a curved configuration; and the configuration of the linking portion between the second side portion s2 and the third side portion s3 is a curved configuration. For example, the high conductivity magnetic portion 10c has a U-shaped configuration.

The low conductivity magnetic portion 10i is connected to one other end of the first side portion s1 (corresponding to the one end portion 10a) and one other end of the second side portion s2 (corresponding to the one other end portion 10b). For example, the low conductivity magnetic portion 10i has a portion extending in the second direction.

The first electrode 11a is connected to the one other end of the first side portion s1 (corresponding to the one end portion 10a). The second electrode 11b is connected to the one other end of the second side portion s2 (corresponding to the one other end portion 10b).

In this example, the first drive electrode 21e of the stress application unit 20 opposes the second drive electrode 22e along a direction (a third direction) perpendicular to the plane (the plane including the first direction and the second direction) in which the magnetic wire 10 extends. Otherwise, the configuration is similar to that of the magnetic memory element 110, and a description is therefore omitted.

According to the magnetic memory elements 111 and 112 as well, a magnetic memory element in which stable operations are possible can be provided.

Figure 8:
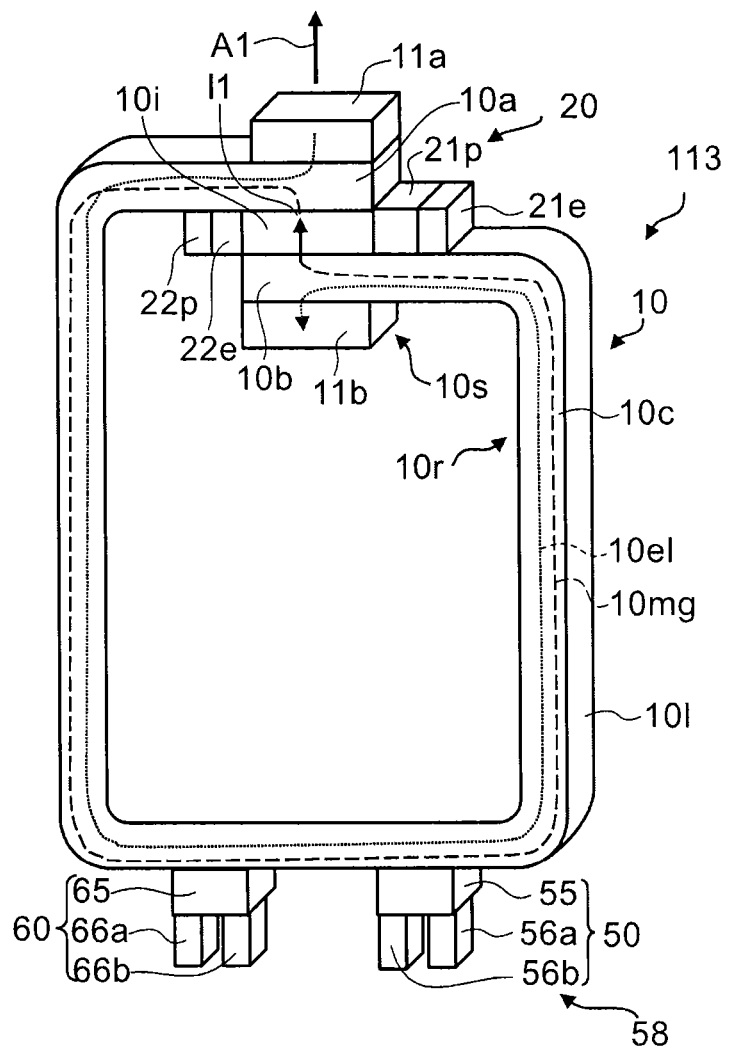
FIG. 8 is a schematic perspective view illustrating a configuration of another magnetic memory element according to the first embodiment.

FIG. 8 is a schematic perspective view illustrating the configuration of another magnetic memory element according to the first embodiment.

In the magnetic memory element 113 according to the embodiment as illustrated in FIG. 8, the one end portion 10a of the high conductivity magnetic portion 10c of the magnetic wire 10 has a portion overlaying the one other end portion 10b. The one end portion 10a has a portion overlaying the one other end portion 10b when projected onto a plane passing through the one end portion 10a perpendicularly to a direction A1 from the inside of the closed loop 10l toward the outside of the closed loop 10l. The low conductivity magnetic portion 10i is disposed between the one other end portion 10b and the overlaying portion of the one end portion 10a recited above.

In this example, a path 11 of a portion of the closed loop 10l of the magnetic wire 10 is along a direction perpendicular to the film surface of the low conductivity magnetic portion 10i.

In this example, the first drive electrode 21e of the stress application unit 20 opposes the second drive electrode 22e along a direction perpendicular to the path 11 of the portion of the closed loop 10l of the magnetic wire 10 recited above. Otherwise, the configuration is similar to that of the magnetic memory element 110, and a description is therefore omitted.

In the magnetic memory element 113, magnetic coupling between the low conductivity magnetic portion 10i and the high conductivity magnetic portion 10c occurs between the film surface of the low conductivity magnetic portion 10i and the film surface of the high conductivity magnetic portion 10c. The magnetic coupling occurs at the film surfaces with the domain walls 16 (the magnetic domains 15) in a good state. Thereby, the movement of the domain walls 16 (the magnetic domains 15) between the low conductivity magnetic portion 10i and the high conductivity magnetic portion 10c is smooth. According to the magnetic memory element 113 as well, a magnetic memory element in which stable operations are possible can be provided.

In this example, for example, the thickness of the one end portion 10a of the magnetic wire 10 may be thinner than the thickness of the one other end portion 10b. Thereby, an asymmetry is formed in the transfer of the magnetization direction via the low conductivity magnetic portion 10i; and a transfer in one direction from the one other end portion 10b to the one end portion 10a can be realized. In such a case, the domain wall movement direction inside the closed loop 10l is caused to be in one direction by setting the orientation of the current such that the current-driven domain wall movement inside the magnetic wire 10 moves in the direction from the one end portion 10a toward the one other end portion 10b.

Figure 9:
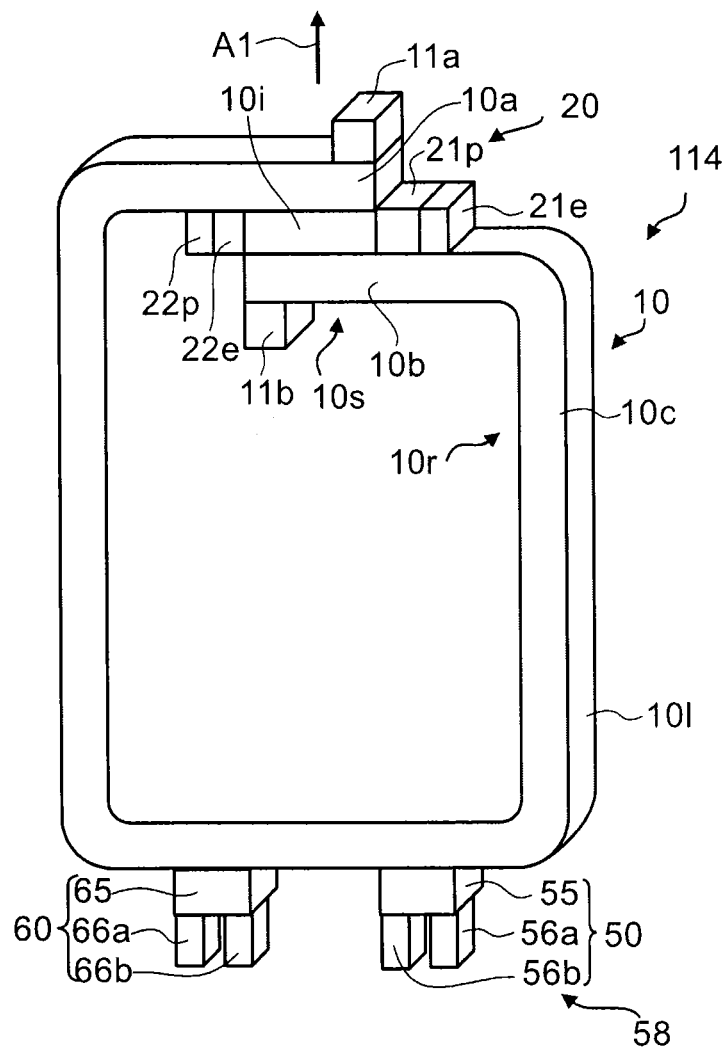
FIG. 9 is a schematic perspective view illustrating a configuration of another magnetic memory element according to the first embodiment.

FIG. 9 is a schematic perspective view illustrating the configuration of another magnetic memory element according to the first embodiment.

In the magnetic memory element 114 according to the embodiment as illustrated in FIG. 9, the first electrode 11a does not overlay the second electrode 11b when projected onto the plane passing through the one end portion 10a perpendicularly to the direction A1 from the inside of the closed loop 10l toward the outside of the closed loop 10l.

For example, a magnetically-altered layer is provided in the high conductivity magnetic portion 10c. For example, the one end portion 10a is characterized by at least one selected from a saturation magnetization Ms and the uniaxial anisotropy constant Ku being smaller than that of the one other end portion 10b. At the one end portion 10a and the one other end portion 10b, an asymmetry relating to at least one selected from the saturation magnetization Ms and the uniaxial anisotropy constant Ku is provided. For example, the magnetically-altered layer may be formed by ion implantation, diffusion, etc.

The magnetization direction of the one other end portion 10b is transferred to the one end portion 10a by ferromagnetical coupling or antiferromagnetical coupling. The magnetization information of the one end portion 10a is not easily transferred to the one other end portion 10b due to the asymmetry recited above. For example, an electron current is caused to flow from the second electrode 11b by injecting a current from the first electrode 11a. When the electron current is caused to flow, the direction of the magnetization 17 of the one end portion 10a efficiently reverses due to the electron current due to the magnetic coupling recited above; and the direction of the magnetization 17 is transferred through the magnetic wire 10. In the magnetic memory element 114, more stable operations are possible.

Figure 10A:
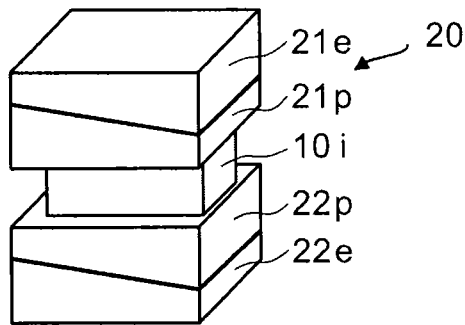
FIG. 10A to FIG. 10C are schematic perspective views illustrating configurations of a portion of the magnetic memory element according to the first embodiment.
Figure 10B:
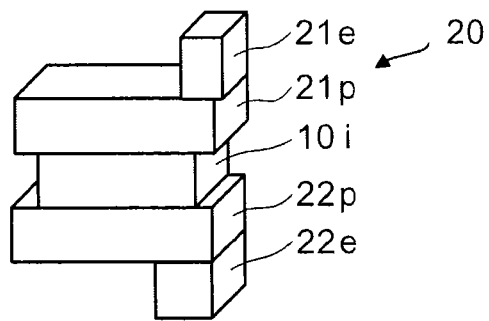
Figure 10C:
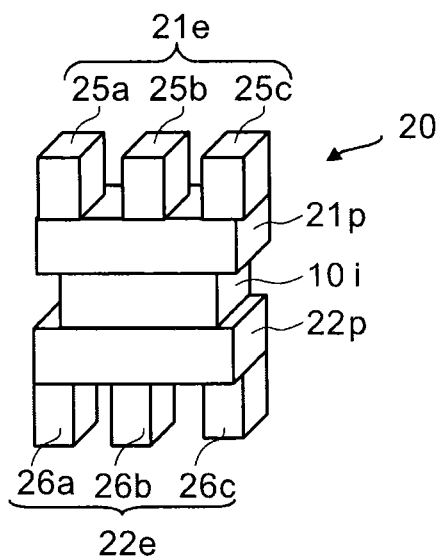

FIG. 10A to FIG. 10C are schematic perspective views illustrating configurations of a portion of the magnetic memory element according to the first embodiment.

These drawings illustrate examples of the configuration of the stress application unit 20.

In the stress application unit 20 of one example as illustrated in FIG. 10A, the thickness of the first piezoelectric material layer 21p changes in a plane perpendicular to the interface between the low conductivity magnetic portion 10i and the first piezoelectric material layer 21p. For example, the thickness of the first piezoelectric material layer 21p changes along the extending direction of the magnetic wire 10. The stress that occurs changes in the first piezoelectric material layer 21p. By this configuration, it is easier to provide directionality to the movement of the domain walls 16. In this example, the thickness of the second piezoelectric material layer 22p changes in the plane perpendicular to the interface between the low conductivity magnetic portion 10i and the second piezoelectric material layer 22p. Thereby, it is more easier to provide the directionality to the movement of the domain walls 16.

In the stress application unit 20 of one example as illustrated in FIG. 10B, the first drive electrode 21e contacts a portion of the first piezoelectric material layer 21p. In other words, the first piezoelectric material layer 21p has a portion that contacts the first drive electrode 21e and a portion that does not contact the first drive electrode 21e. For example, stress is caused to occur in one portion of the first piezoelectric material layer 21p by applying an external voltage; and the elastic wave that occurs in the other portion is utilized. By this configuration, it is easier to provide the directionality to the movement of the domain walls 16. In this example, the second drive electrode 22e contacts one portion of the second piezoelectric material layer 22p. Thereby, it is more easier to provide the directionality to the movement of the domain walls 16.

In the stress application unit 20 of one example as illustrated in FIG. 10C, the first drive electrode 21e includes multiple component electrodes 25a to 25c. Multiple first drive electrodes 21e may be considered to be provided. The timing when the voltage is applied to the multiple component electrodes 25a to 25c is shifted. By this configuration, it is easier to provide the directionality to the movement of the domain walls 16. In this example, the second drive electrode 22e includes multiple component electrodes 26a to 26c. Multiple second drive electrodes 22e may be considered to be provided. Thereby, it is easier to provide the directionality to the movement of the domain walls 16.

Figure 11:
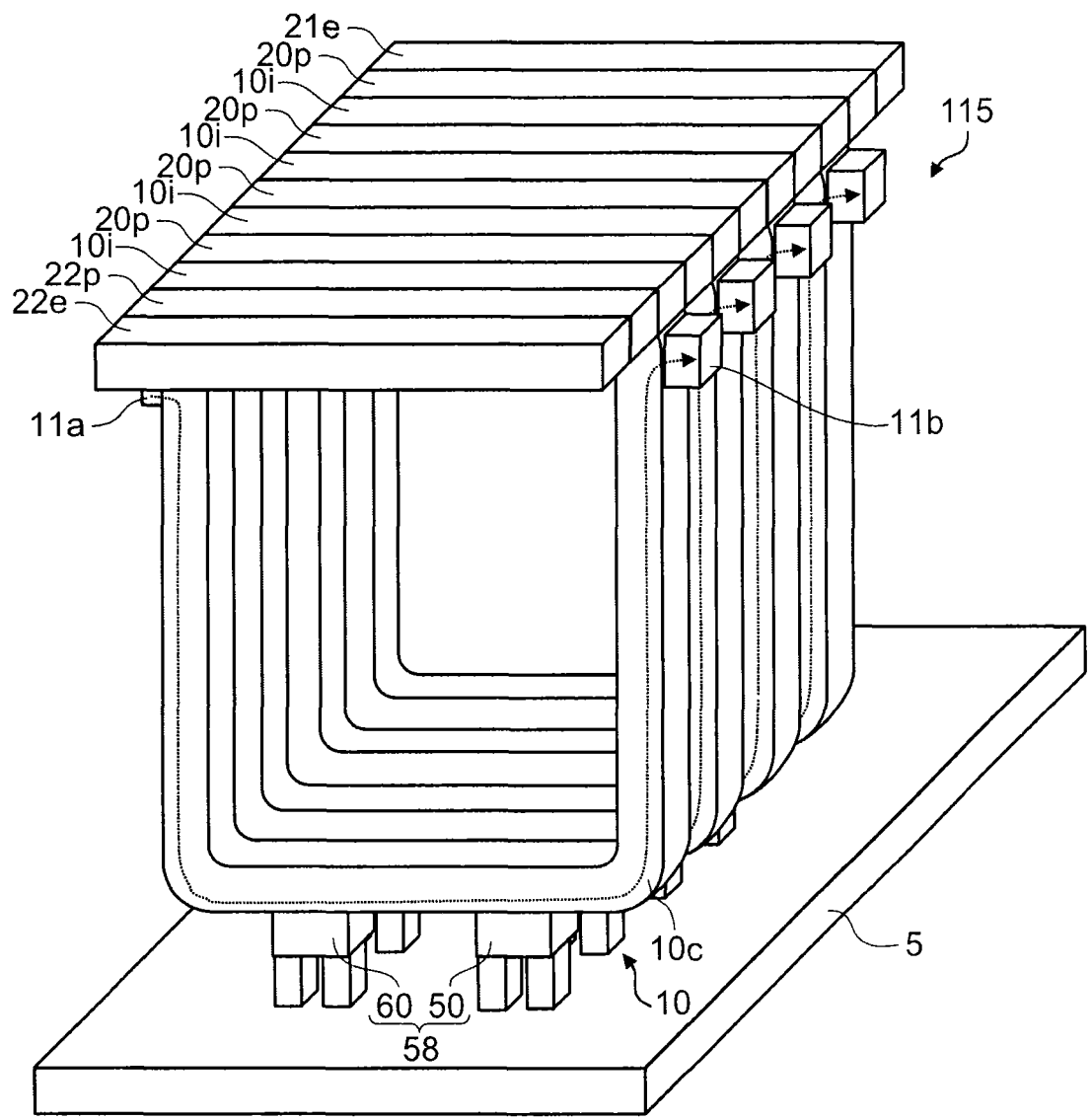
FIG. 11 is a schematic perspective view illustrating a configuration of another magnetic memory element according to the first embodiment.

FIG. 11 is a schematic perspective view illustrating the configuration of another magnetic memory element according to the first embodiment.

A substrate 5 is provided in the magnetic memory element 115 according to the embodiment as illustrated in FIG. 11. Multiple magnetic wires 10, multiple first electrodes 11a, multiple second electrodes 11b, multiple stress application units 20, and multiple recording/reproducing units 58 are provided on the substrate 5. The storage capacity increases by providing the multiple magnetic wires 10. In this configuration, a pair of electrodes is provided for the multiple magnetic wires to apply the external pressure. That is, a large surface area is unnecessary for the electrodes of the configuration illustrated in FIG. 11 compared to the configuration in which a pair of stress application electrodes is provided for each magnetic wire of each closed circuit such as those illustrated in FIG. 1, FIG. 2, FIG. 6, FIG. 7, FIG. 8, and FIG. 9. Therefore, it is easier to increase the density as a memory. Thus, the mechanism that performs the stress application simultaneously for the multiple magnetic wires of each block is a configuration that is effective from the viewpoint of increasing the memory density.

Figure 12:
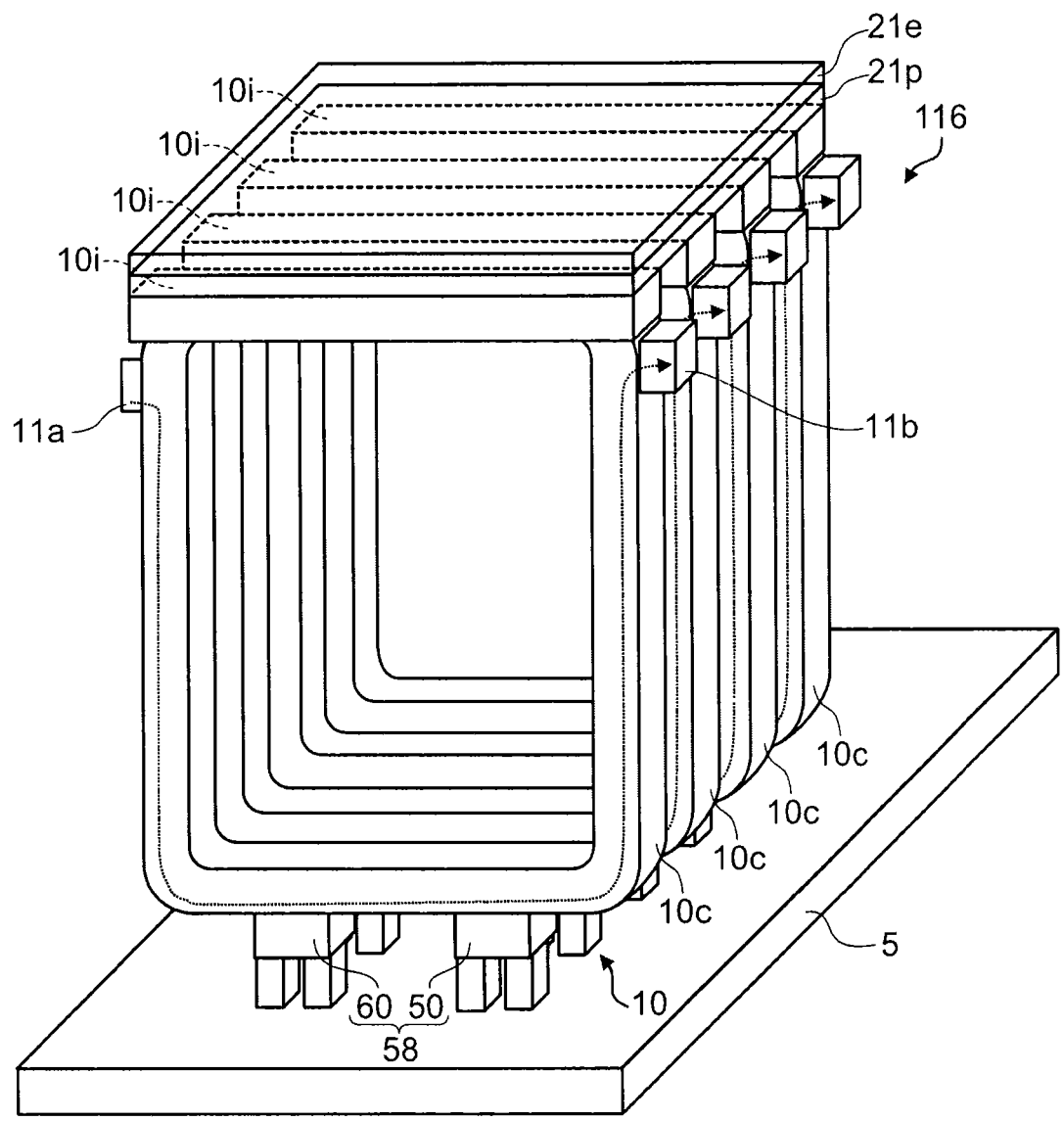
FIG. 12 is a schematic perspective view illustrating a configuration of another magnetic memory element according to the first embodiment.

FIG. 12 is a schematic perspective view illustrating the configuration of another magnetic memory element according to the first embodiment.

In the magnetic memory element 116 according to the embodiment as illustrated in FIG. 12, the multiple magnetic wires 10, the multiple first electrodes 11a, the multiple second electrodes 11b, and the multiple recording/reproducing units 58 are provided on the substrate 5. In this example, one stress application unit 20 is provided. The one stress application unit 20 applies the stress to the multiple magnetic wires 10 (in this example, the low conductivity magnetic portions 10i).

In this example as well, similarly to the configuration illustrated in FIG. 11, it is easy to increase the memory density because a pair of electrodes are provided for the multiple magnetic wires in this configuration.

Figures 13A, 13B:
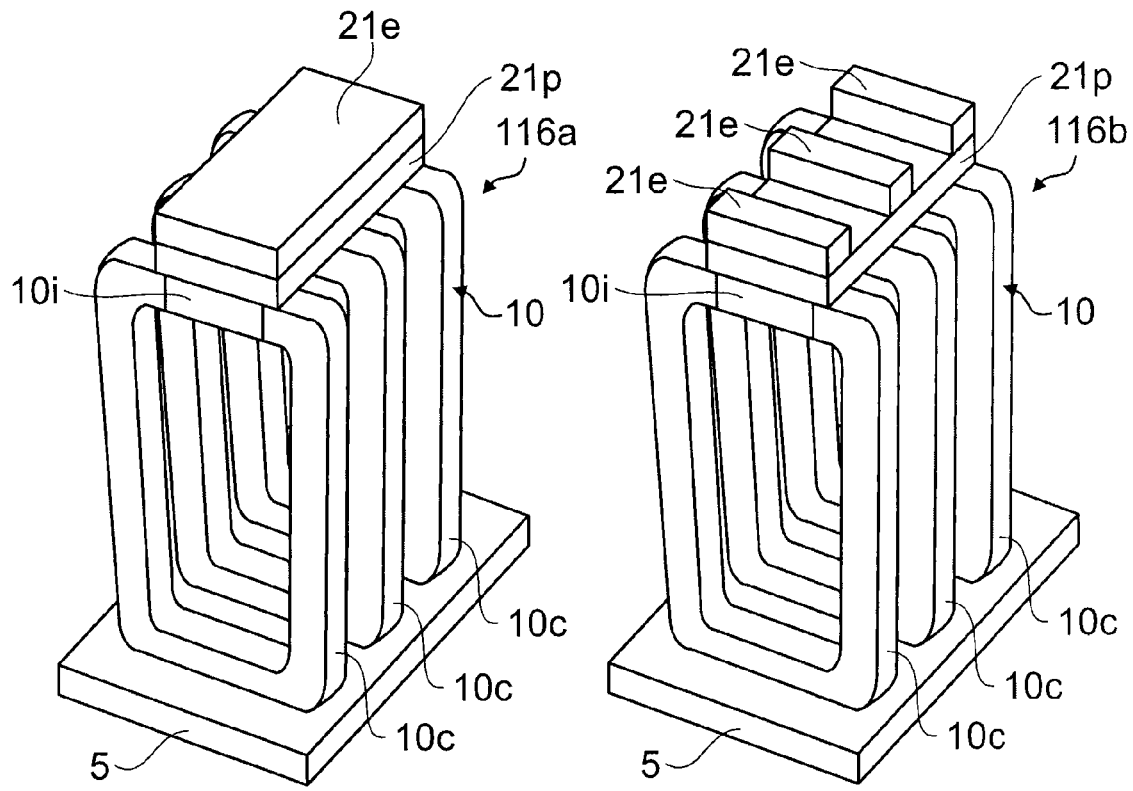
FIG. 13A to FIG. 13C are schematic perspective views illustrating configurations of other magnetic memory elements according to the first embodiment.
Figure 13C:
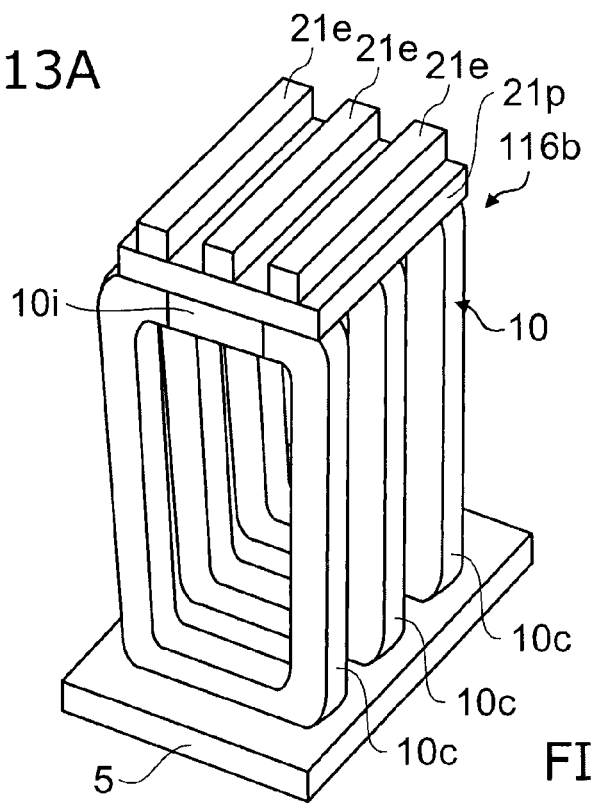

FIG. 13A to FIG. 13C are schematic perspective views illustrating the configurations of other magnetic memory elements according to the first embodiment.

In the magnetic memory elements 116a to 116c according to the embodiment as illustrated in FIG. 13A to FIG. 13C, the multiple magnetic wires 10, the multiple first electrodes 11a, the multiple second electrodes 11b, and the multiple recording/reproducing units 58 are provided on the substrate 5. One stress application unit 20 applies the stress to the multiple magnetic wires 10 (in this example, the low conductivity magnetic portions 10i).

In these examples as well, similarly to FIG. 11 and FIG. 12, it is easy to increase the memory density because a configuration is formed in which a pair of electrodes is provided for the multiple magnetic wires. In the magnetic memory elements 116a to 116c as well, a voltage may be applied to the piezoelectric material to provide directionality to the domain wall movement. For example, in the example illustrated in FIG. 13C, mutually different voltages may be applied to the multiple electrodes (the first drive electrodes e1) that are disposed in parallel. Even in such a case, it is easier to increase the memory density because the number of the electrodes for all of the multiple magnetic wires can be reduced compared to the case where a pair of electrodes is provided for each of the magnetic wires.

In the magnetic memory element 116a, the number of the first drive electrodes 21e of the stress application unit 20 is one. In the magnetic memory elements 116b and 116c, the number of the first drive electrodes 21e of the stress application unit 20 is three. The first drive electrode 21e may be multiply provided. In the magnetic memory element 116b, each of the multiple first drive electrodes 21e extends along a plane that includes the extension direction of the multiple magnetic wires 10. In the magnetic memory element 116c, each of the multiple first drive electrodes 21e extends along a direction orthogonal to the plane that includes the extension direction of the multiple magnetic wires 10.

According to the magnetic memory elements 115, 116, and 116a to 116c as well, a magnetic memory element in which stable operations are possible can be provided.

Second Embodiment

Figure 14:
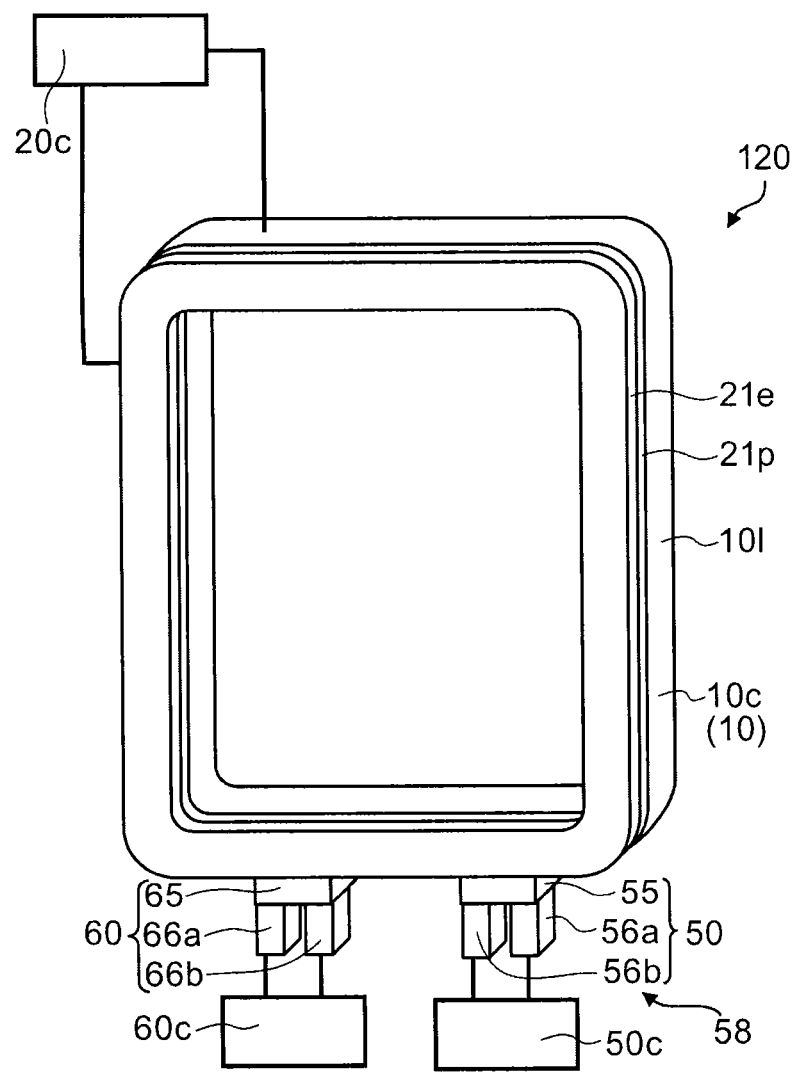
FIG. 14 is a schematic perspective view illustrating a configuration of a magnetic memory element according to a second embodiment.

FIG. 14 is a schematic perspective view illustrating the configuration of a magnetic memory element according to a second embodiment. As illustrated in FIG. 14, the magnetic memory element 120 according to the embodiment includes the magnetic wire 10, the stress application unit 20, and the recording/reproducing unit 58. In this example, the low conductivity magnetic portion 10i is not provided in the magnetic wire 10. The magnetic wire 10 is formed of the high conductivity magnetic portion 10c. The magnetic wire 10 is the closed loop 10l.

When the stress is applied by the stress application unit 20, an inverse magnetostrictive effect occurs in the magnetization of the magnetic wire 10. Thereby, the magnetization direction of the magnetic wire 10 (the high conductivity magnetic portion 10c) changes. It is possible to move the domain walls along the magnetic wire 10 by the stress application being performed along the magnetic wire 10 to cause the magnetization direction change.

The stress application unit 20 includes the first drive electrode 21e and the first piezoelectric material layer 21p. The first drive electrode 21e is provided along the magnetic wire 10. The first piezoelectric material layer 21p is provided between the first drive electrode 21e and the magnetic wire 10. For example, the first piezoelectric material layer 21p contacts the magnetic wire 10 along the entire closed loop 10l. Otherwise, the configuration is similar to that of the magnetic memory element 110, and a description is therefore omitted.

In this example, the first drive electrode 21e and the magnetic wire 10 (the high conductivity magnetic portion 10c) are electrically connected to the stress application circuit 20c. A voltage is applied to the first piezoelectric material layer 21p by applying the voltage between the first drive electrode 21e and the magnetic wire 10. Stress is applied to the magnetic wire 10 by the first piezoelectric material layer 21p. Thereby, the domain walls 16 of the magnetic wire 10 circle around by moving through the magnetic wire 10 along the closed loop 10l of the magnetic wire 10.

In such a case as well, the recording/reproducing unit 58 writes the memory information by changing the orientations of the magnetizations 17 of the magnetic domains 15 that circle around as the domain walls 16 circle around and reads the written memory information by detecting the orientations of the magnetizations 17 of the magnetic domains 15 that circle around.

According to the embodiment as well, a magnetic memory element in which stable operations are possible can be provided.

For example, in the embodiment, a current is not caused to flow in the magnetic wire 10. The domain walls 16 are caused to move due to the stress applied to the magnetic wire 10. The voltage supplied to the stress application unit 20 is used without using a current to move the domain walls 16. Thereby, the power consumption can be reduced. Also, the configuration is simple; and it is easy to increase the storage density.

The configurations described in regard to the first embodiment are applicable to the magnetic wire 10 (the high conductivity magnetic portion 10c), the stress application unit 20, and the recording/reproducing unit 58 of the magnetic memory element 120.

Figure 15:
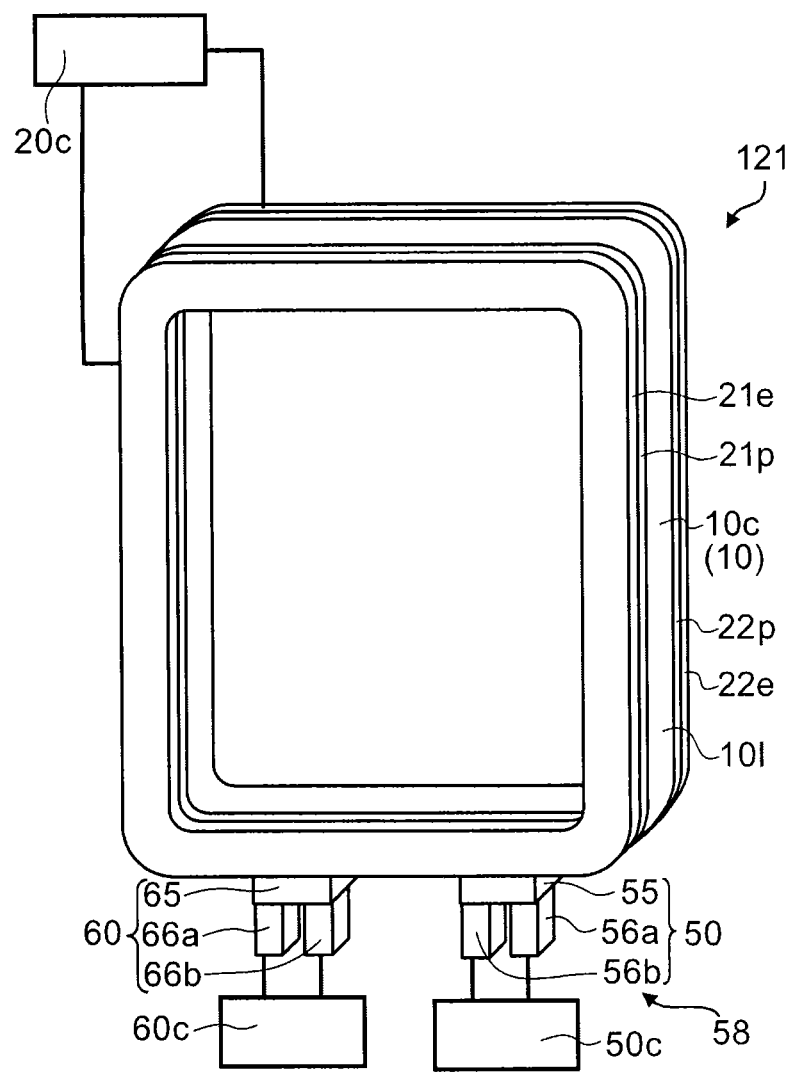
FIG. 15 is a schematic perspective view illustrating a configuration of another magnetic memory element according to the second embodiment.

FIG. 15 is a schematic perspective view illustrating the configuration of another magnetic memory element according to the second embodiment.

In the magnetic memory element 121 according to the embodiment as illustrated in FIG. 15, the stress application unit 20 further includes the second drive electrode 22e and the second piezoelectric material layer 22p. The second drive electrode 22e is provided along the magnetic wire 10. The magnetic wire 10 is disposed between the first drive electrode 21e and the second drive electrode 22e. The second piezoelectric material layer 22p is provided between the second drive electrode 22e and the magnetic wire 10. In such a case, the first drive electrode 21e and the second drive electrode 22e are electrically connected to the stress application circuit 20c. A voltage is applied to the first piezoelectric material layer 21p and the second piezoelectric material layer 22p by applying the voltage between the first drive electrode 21e and the second drive electrode 22e. Stress is applied to the magnetic wire 10 by the first piezoelectric material layer 21p and the second piezoelectric material layer 22p. Thereby, the domain walls 16 of the magnetic wire 10 circle around by moving through the magnetic wire 10 along the closed loop 10l of the magnetic wire 10. In this example, the magnetic wire 10 may be further connected to the stress application circuit 20c to independently apply the desired voltages to the first piezoelectric material layer 21p and the second piezoelectric material layer 22p.

According to the magnetic memory element 121 as well, a magnetic memory element in which stable operations are possible can be provided.

Figure 16:
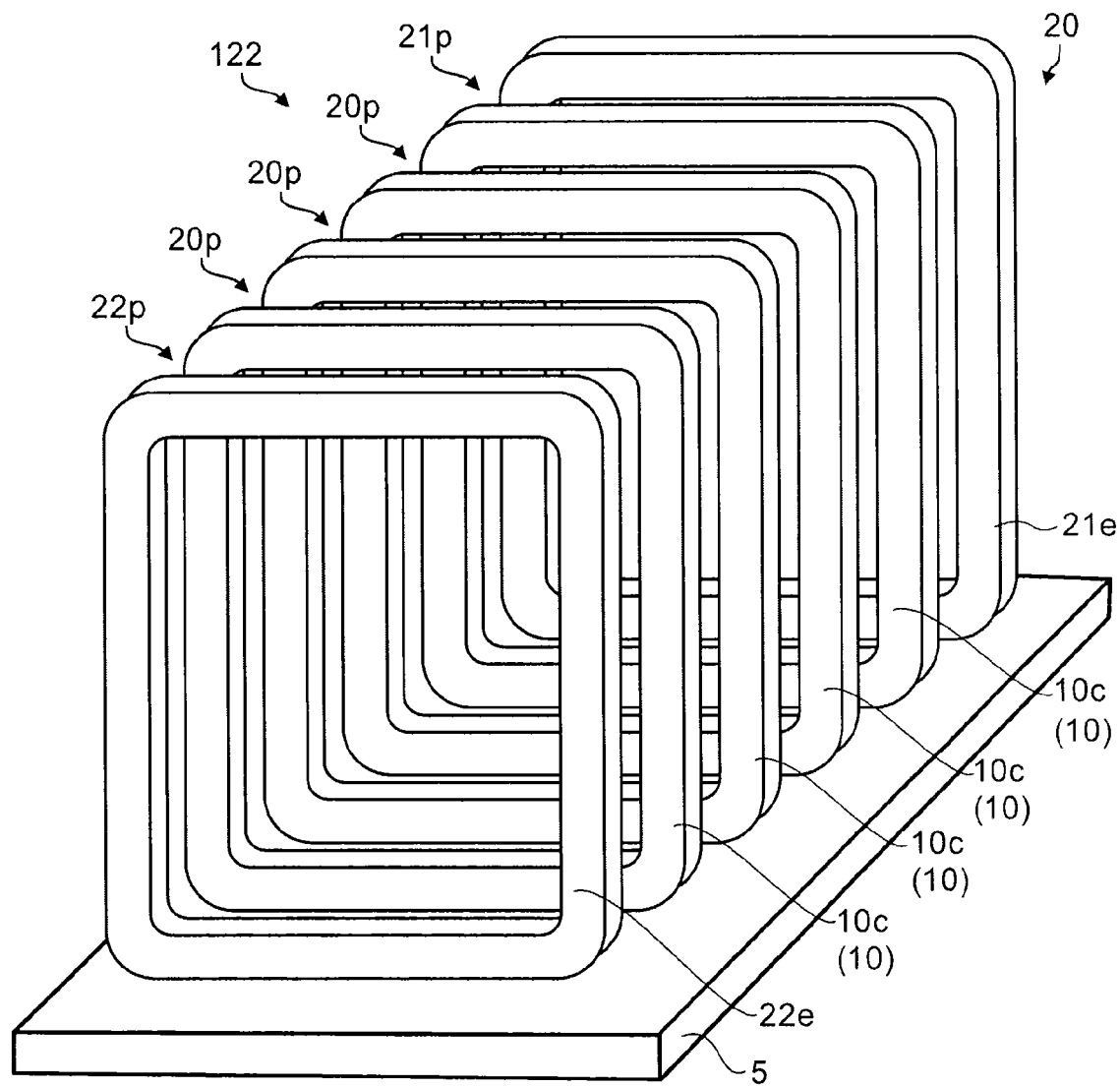
FIG. 16 is a schematic perspective view illustrating a configuration of another magnetic memory element according to the second embodiment.

FIG. 16 is a schematic perspective view illustrating the configuration of another magnetic memory element according to the second embodiment.

The substrate 5 is provided in the magnetic memory element 122 according to the embodiment as illustrated in FIG. 16. The multiple magnetic wires 10 and the multiple recording/reproducing units 58 (not illustrated in FIG. 16) are provided on the substrate 5. In this example, one stress application unit 20 is provided. The multiple magnetic wires 10 are disposed between the first drive electrode 21e and the second drive electrode 22e of the stress application unit 20. The piezoelectric material layers 20p are disposed between the multiple magnetic wires 10. The stress application unit 20 applies the stress to the multiple magnetic wires 10.

According to the magnetic memory element 121 as well, a magnetic memory element in which stable operations are possible can be provided. The storage capacity increases by providing the multiple magnetic wires 10.

Figure 17:
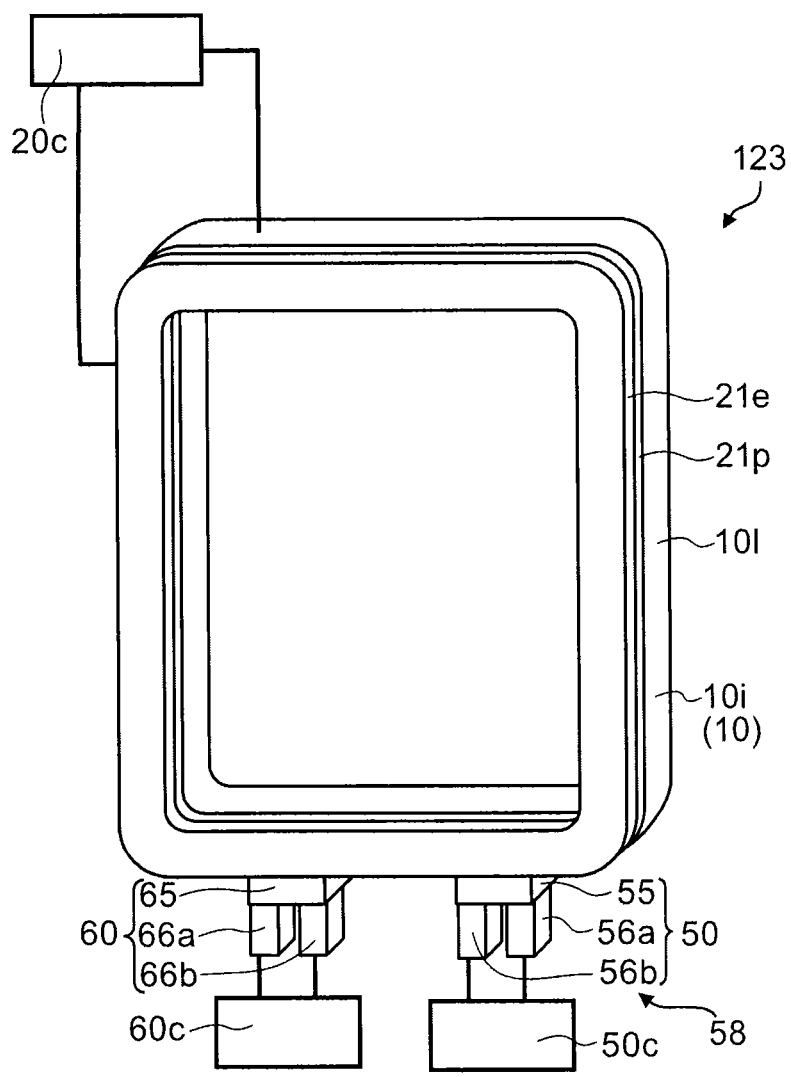
FIG. 17 is a schematic perspective view illustrating a configuration of another magnetic memory element according to the second embodiment.

FIG. 17 is a schematic perspective view illustrating the configuration of another magnetic memory element according to the second embodiment.

As illustrated in FIG. 17, the magnetic memory element 123 according to the embodiment includes the magnetic wire 10, the stress application unit 20, and the recording/reproducing unit 58. In this example, the high conductivity magnetic portion 10c is not provided in the magnetic wire 10. The magnetic wire 10 is formed of the low conductivity magnetic portion 10i. The magnetic wire 10 is the closed loop 10l.

In such a case as well, when the stress is applied by the stress application unit 20, the inverse magnetostrictive effect occurs in the magnetization of the magnetic wire 10. Thereby, the magnetization direction of the magnetic wire 10 (the low conductivity magnetic portion 10i) changes. It is possible to move the domain walls along the magnetic wire 10 by the stress application being performed along the magnetic wire 10 to cause the magnetization direction change.

In such a case as well, the recording/reproducing unit 58 writes the memory information by changing the orientations of the magnetizations 17 of the magnetic domains 15 that circle around as the domain walls 16 circle around and reads the written memory information by detecting the orientations of the magnetizations 17 of the magnetic domains 15 that circle around.

According to the embodiment as well, a magnetic memory element in which stable operations are possible can be provided.

For example, in the embodiment, the current is not caused to flow in the magnetic wire 10. The domain walls 16 are caused to move due to the stress applied to the magnetic wire 10. The voltage supplied to the stress application unit 20 is used without using a current to move the domain walls 16. Thereby, the power consumption can be reduced. Also, the configuration is simple; and it is easy to increase the storage density.

Figure 18:
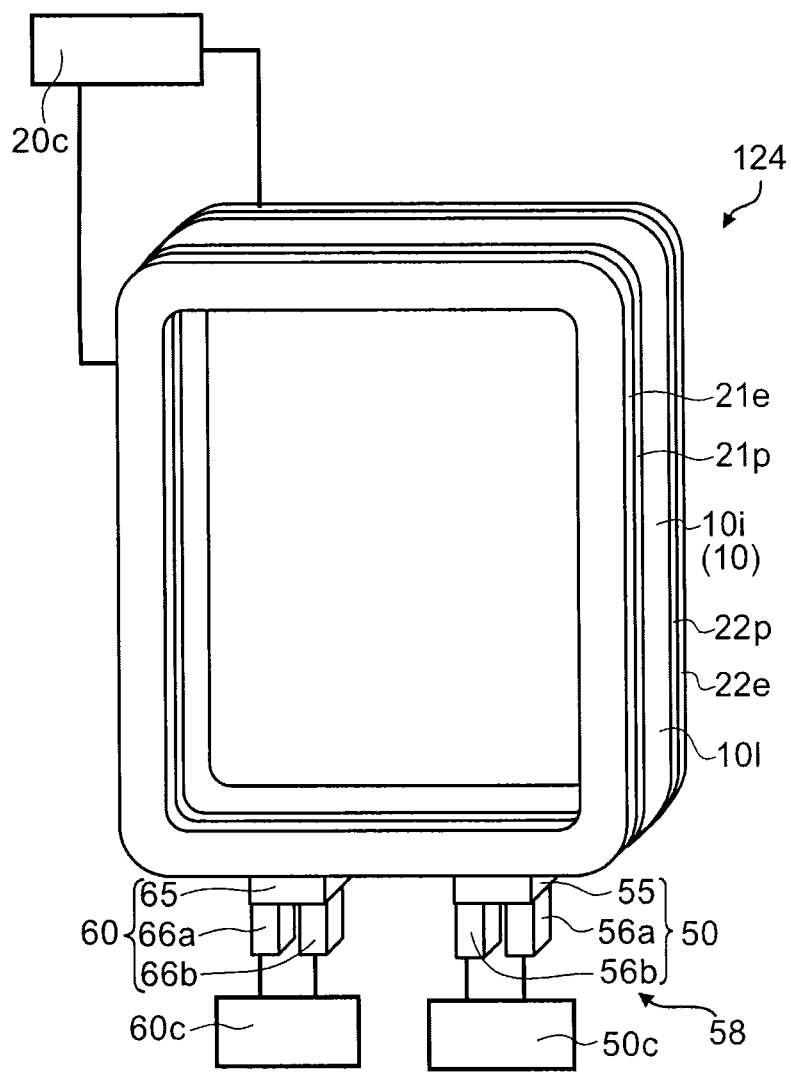
FIG. 18 is a schematic perspective view illustrating a configuration of another magnetic memory element according to the second embodiment.

FIG. 18 is a schematic perspective view illustrating the configuration of another magnetic memory element according to the second embodiment.

In the magnetic memory element 124 according to the embodiment as illustrated in FIG. 18, the magnetic wire 10 is formed of the low conductivity magnetic portion 10i. The stress application unit 20 further includes the second drive electrode 22e and the second piezoelectric material layer 22p. The second drive electrode 22e is provided along the magnetic wire 10. The magnetic wire 10 is disposed between the first drive electrode 21e and the second drive electrode 22e. The second piezoelectric material layer 22p is provided between the second drive electrode 22e and the magnetic wire 10.

According to the magnetic memory element 124 as well, a magnetic memory element in which stable operations are possible can be provided.

Figure 19:
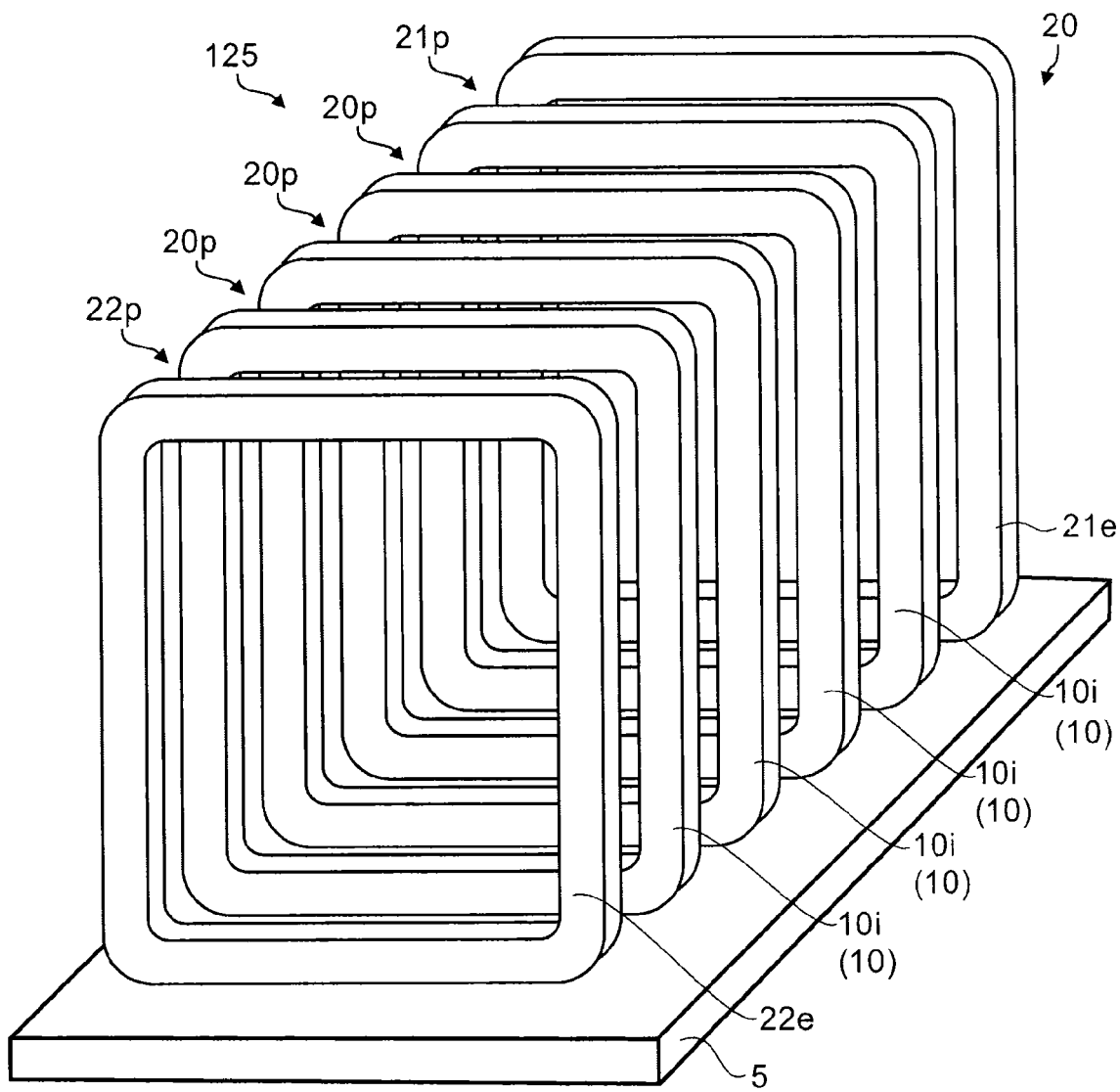
FIG. 19 is a schematic perspective view illustrating a configuration of another magnetic memory element according to the second embodiment.

FIG. 19 is a schematic perspective view illustrating the configuration of another magnetic memory element according to the second embodiment.

In the magnetic memory element 125 according to the embodiment as illustrated in FIG. 19, the magnetic wire 10 is formed of the low conductivity magnetic portion 10i. The substrate 5 is provided in this example as well. The multiple magnetic wires 10 and the multiple recording/reproducing units 58 (not illustrated in FIG. 19) are provided on the substrate 5. In this example, one stress application unit 20 is provided. The multiple magnetic wires 10 are disposed between the first drive electrode 21e and the second drive electrode 22e of the stress application unit 20. The piezoelectric material layers 20p are disposed between the multiple magnetic wires 10. The stress application unit 20 applies the stress to the multiple magnetic wires 10.

According to the magnetic memory element 125 as well, a magnetic memory element in which stable operations are possible can be provided. The storage capacity increases by providing the multiple magnetic wires 10.

Third Embodiment

Figure 20:
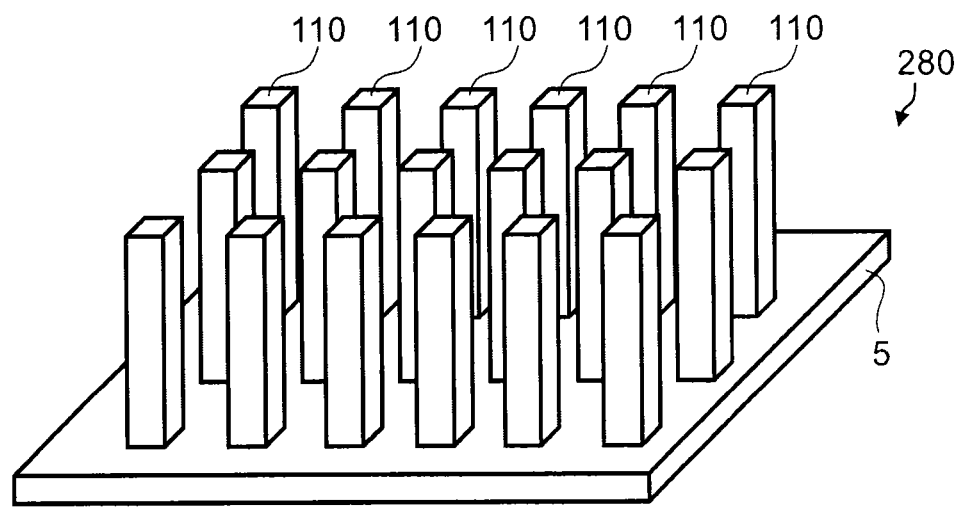
FIG. 20 is a schematic perspective view illustrating a configuration of a magnetic memory device according to a third embodiment.

FIG. 20 is a schematic perspective view illustrating the configuration of a magnetic memory device according to a third embodiment. As illustrated in FIG. 20, the magnetic memory device 280 according to the embodiment includes multiple magnetic memory elements. In this example, the magnetic memory element 110 described in regard to the first embodiment is used as the magnetic memory element. The embodiment is not limited thereto. Any magnetic memory element described in regard to the first and second embodiments and a modification of any magnetic memory element described in regard to the first and second embodiments may be used.

According to the magnetic memory device 280, a magnetic memory device in which stable operations are possible can be provided.

Figure 21:
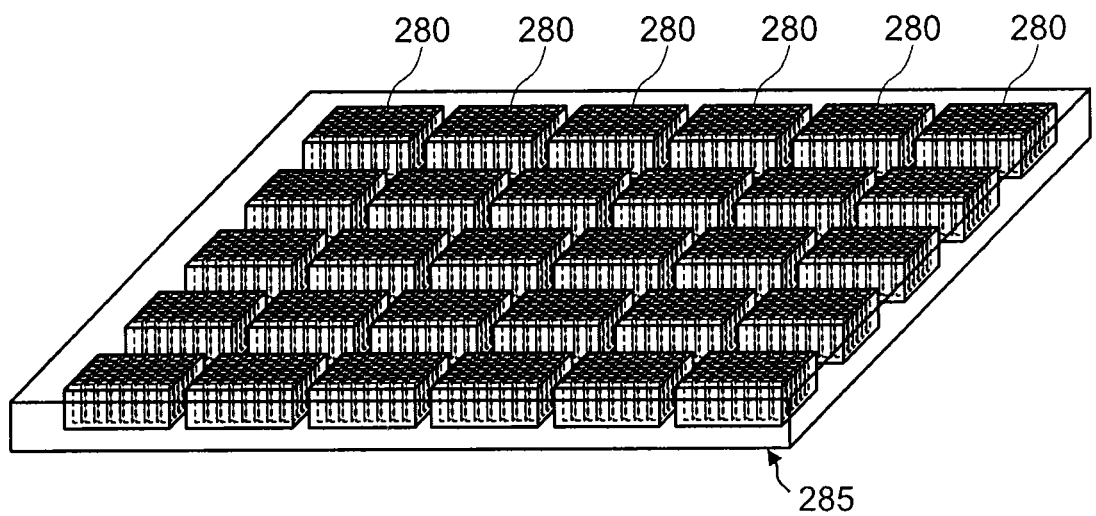
FIG. 21 is a schematic perspective view illustrating a configuration of another magnetic memory device according to the third embodiment.

FIG. 21 is a schematic perspective view illustrating the configuration of another magnetic memory device according to the third embodiment.

The magnetic memory device 280 described in regard to FIG. 20 is multiply included in the magnetic memory 285 according to the embodiment as illustrated in FIG. 21. The magnetic memory device 280 is used as one block. The multiple magnetic memory devices 280 are arranged along a column direction or a row direction. Not-illustrated transistors are disposed in a layer under the blocks.

Figure 22:
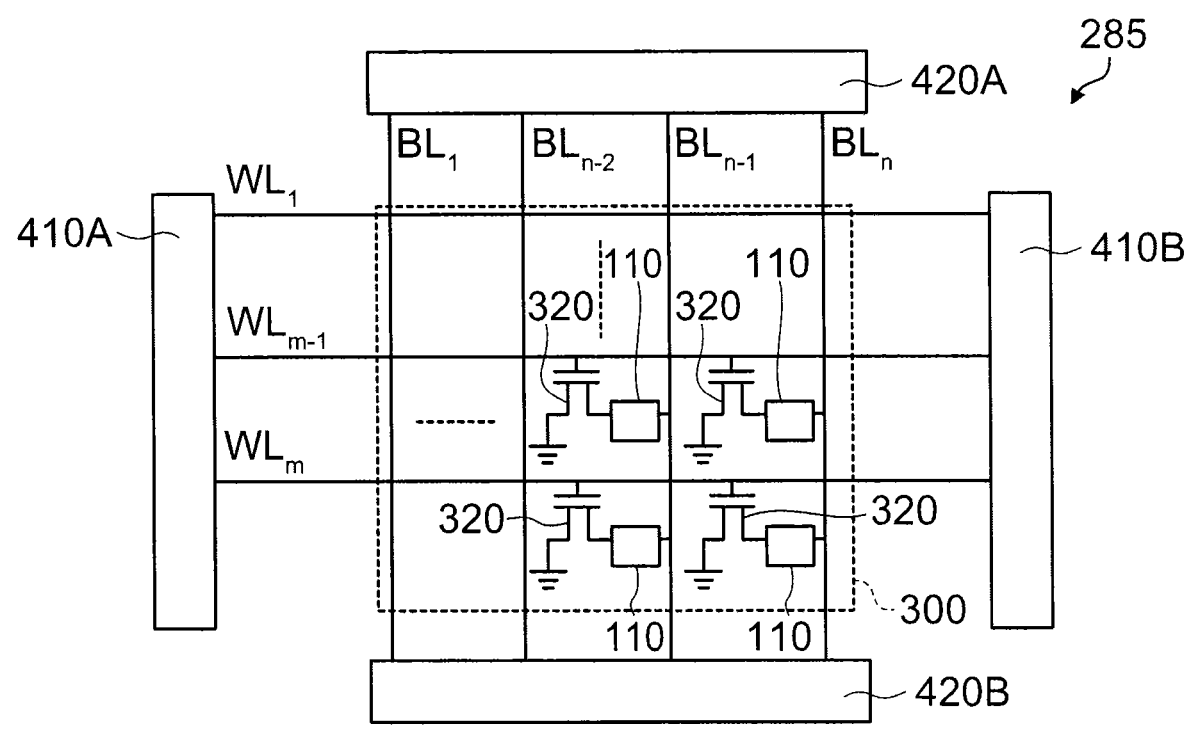
FIG. 22 is a schematic perspective view illustrating a configuration of another magnetic memory device according to the third embodiment.

FIG. 22 is a schematic perspective view illustrating the configuration of another magnetic memory device according to the third embodiment.

As illustrated in FIG. 22, the magnetic memory 285 includes a memory cell array 300. The memory cell array 300 includes multiple memory cells arranged in a matrix configuration. For example, the memory cell includes the magnetic memory element 110 and a switching element 320. The memory cell may include any magnetic memory element according to the first and second embodiments and a modification of any magnetic memory element according to the first and second embodiments.

In the memory cell array 300, word lines WL1 to WLm are provided for the rows; and bit lines BL1 to BLn for reading the information are provided for the columns.

The word lines WL1 to WLm are connected to drive circuits 410A and 410B that include the decoder, the write circuit, etc., that select each of the interconnects. The bit lines BL1 to BLn are connected to drive circuits 420A and 420B that include the decoder, the read-out circuit, etc., that select each of the interconnects.

The recording/reproducing unit 58 of the magnetic memory element 110 is not illustrated in FIG. 22. For example, one end of the recording/reproducing unit 58 is connected to a not-illustrated switching element for write selection. One other end of the recording/reproducing unit 58 is connected to a not-illustrated current source.

One recording/reproducing unit 58 may be provided for multiple memory cells. In such a case, the bit density can be increased. In the case where one recording/reproducing unit 58 is provided for each of the memory cells, the transfer speed of the data can be increased.

According to the embodiments, a magnetic memory element, a magnetic memory, and a magnetic memory device in which stable operations are possible can be provided.

Hereinabove, exemplary embodiments of the invention are described with reference to specific examples. However, the invention is not limited to these specific examples. For example, one skilled in the art may similarly practice the invention by appropriately selecting specific configurations of components included in magnetic memory elements, magnetic memory devices, and magnetic memories such as magnetic wires, high conductivity magnetic portions, low conductivity magnetic portions, stress application units, drive electrodes, piezoelectric material layers, recording/reproducing units, write units, read-out units, etc., from known art; and such practice is included in the scope of the invention to the extent that similar effects are obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory element, comprising:
   a magnetic wire including a plurality of domain walls and a plurality of magnetic domains separated by the domain walls, the magnetic wire being a closed loop;
   a stress application unit configured to cause the domain walls to circle around along the closed loop a plurality of times by applying stress to the magnetic wire; and
   a recording/reproducing unit configured to write memory information by changing magnetizations of the circling magnetic domains as the domain walls circle around and to read the written memory information by detecting the magnetizations of the circling magnetic domains.

2. The element according to claim 1, further comprising:
   a first electrode; and
   a second electrode,
   the magnetic wire including:
      a high conductivity magnetic portion having one end portion and one other end portion, the high conductivity magnetic portion extending along one portion of the closed loop between the one end portion and the one other end portion; and
      a low conductivity magnetic portion extending along one other portion of the closed loop to connect the one end portion to the one other end portion, a conductivity of the low conductivity magnetic portion being lower than a conductivity of the high conductivity magnetic portion, the stress being applied to the low conductivity magnetic portion by the stress application unit,
   the first electrode being electrically connected to the one end portion,
   the second electrode being electrically connected to the one other end portion.

3. The element according to claim 2, wherein the low conductivity magnetic portion is magnetically coupled to the high conductivity magnetic portion.

4. The element according to claim 2, wherein the low conductivity magnetic portion includes at least one selected from a magnetic oxide, a magnetic nitride, and a magnetic oxynitride.

5. The element according to claim 2, wherein the low conductivity magnetic portion includes at least one selected from an oxide, a nitride, and an oxynitride, the oxide including at least one selected from Fe, Co, and Ni, the nitride including at least one selected from Fe, Co, and Ni, the oxynitride including at least one selected from Fe, Co, and Ni.

6. The element according to claim 2, wherein the absolute value of a magnetostriction constant of the low conductivity magnetic portion is not less than $10^{-5}$ and not more than $10^{-2}$.

7. The element according to claim 2, wherein the stress application unit contacts the low conductivity magnetic portion.

8. The element according to claim 2, wherein the stress application unit includes:
   a first drive electrode; and
   a first piezoelectric material layer provided between the first drive electrode and the low conductivity magnetic portion.

9. The element according to claim 8, wherein the stress application unit further includes:
   a second drive electrode, the low conductivity magnetic portion being disposed between the first drive electrode and the second drive electrode; and
   a second piezoelectric material layer provided between the second drive electrode and the low conductivity magnetic portion.

10. The element according to claim 1, wherein the stress application unit includes:
    a first drive electrode provided along the magnetic wire; and
    a first piezoelectric material layer provided between the first drive electrode and the magnetic wire.

11. The element according to claim 10, wherein the stress application unit further includes:
    a second drive electrode provided along the magnetic wire, the magnetic wire being disposed between the first drive electrode and the second drive electrode; and
    a second piezoelectric material layer provided between the second drive electrode and the magnetic wire.

12. The element according to claim 8, wherein the first drive electrode contacts a portion of the first piezoelectric material layer.

13. The element according to claim 8, wherein a thickness of the first piezoelectric material layer changes along an extending direction of the magnetic wire.

14. The element according to claim 1, wherein:
    the magnetic wire has a first portion and a second portion; and
    the recording/reproducing unit includes
       a write unit configured to write the memory information by changing the magnetizations of the circling magnetic domains at the first portion, and
       a read-out unit configured to read the written memory information by detecting the magnetizations of the circling magnetic domains at the second portion.

15. The element according to claim 14, wherein the write unit is configured to implement the writing operation drw/v (seconds) after the read-out unit implements the read-out operation, where drw (meters) is a distance from a position of the closed loop at the second portion to a position of the closed loop at the first portion along the closed loop along a direction of the movement of the domain walls, and v (meters/second) is a velocity of the movement of the magnetic domains along the closed loop.

16. The element according to claim 1, wherein:
a plurality of the magnetic wires is provided; and
the stress application unit is configured to apply the stress to the plurality of magnetic wires.

17. The element according to claim 1, wherein the stress application unit includes at least one selected from PZT (Pb(Zr, Ti)O$_3$), AlN, PLZT (lead zirconate titanate), KNbO$_3$, ZnO, SiO$_2$, LiNbO$_3$, La$_3$Ga$_5$SiO$_{14}$, KNaC$_4$H$_4$O$_6$.4H$_2$O, and Li$_2$B$_4$O$_7$.

18. A magnetic memory element, comprising:
a magnetic wire including a plurality of domain walls and a plurality of magnetic domains separated by the domain walls, the magnetic wire being a closed loop;
a stress application unit configured to cause the domain walls to circle around along the closed loop a plurality of times by applying stress to the magnetic wire;
a recording/reproducing unit configured to write memory information by changing magnetizations of the circling magnetic domains as the domain walls circle around and read the written memory information by detecting the magnetizations of the circling magnetic domains;
a first electrode; and
a second electrode,
the magnetic wire including:
a high conductivity magnetic portion having one end portion and one other end portion, the high conductivity magnetic portion extending along one portion of the closed loop between the one end portion and the one other end portion; and
a low conductivity magnetic portion extending along one other portion of the closed loop to connect the one end portion to the one other end portion, a conductivity of the low conductivity magnetic portion being lower than a conductivity of the high conductivity magnetic portion, the stress being applied to the low conductivity magnetic portion by the stress application unit,
the first electrode being electrically connected to the one end portion,
the second electrode being electrically connected to the one other end portion,
the one end portion having a portion overlaying the one other end portion,
the low conductivity magnetic portion being disposed between the overlaying portion and the one other end portion.

19. The element according to claim 18, wherein the first electrode does not overlay the second electrode.

20. A magnetic memory device, comprising a plurality of magnetic memory elements,
each of the magnetic memory elements including:
a magnetic wire including a plurality of domain walls and a plurality of magnetic domains separated by the domain walls, the magnetic wire being a closed loop;
a stress application unit configured to cause the domain walls to circle around along the closed loop a plurality of times by applying stress to the magnetic wire; and
a recording/reproducing unit configured to write memory information by changing magnetizations of the circling magnetic domains as the domain walls circle around and to read the written memory information by detecting the magnetizations of the circling magnetic domains.

21. A magnetic memory device, comprising a plurality of magnetic memory elements,
each of the magnetic memory elements including:
a magnetic wire including a plurality of domain walls and a plurality of magnetic domains separated by the domain walls, the magnetic wire being a closed loop;
a stress application unit configured to cause the domain walls to circle around along the closed loop a plurality of times by applying stress to the magnetic wire;
a recording/reproducing unit configured to write memory information by changing magnetizations of the circling magnetic domains as the domain walls circle around and read the written memory information by detecting the magnetizations of the circling magnetic domains;
a first electrode; and
a second electrode,
the magnetic wire including:
a high conductivity magnetic portion having one end portion and one other end portion, the high conductivity magnetic portion extending along one portion of the closed loop between the one end portion and the one other end portion; and
a low conductivity magnetic portion extending along one other portion of the closed loop to connect the one end portion to the one other end portion, a conductivity of the low conductivity magnetic portion being lower than a conductivity of the high conductivity magnetic portion, the stress being applied to the low conductivity magnetic portion by the stress application unit,
the first electrode being electrically connected to the one end portion,
the second electrode being electrically connected to the one other end portion,
the one end portion having a portion overlaying the one other end portion,
the low conductivity magnetic portion being disposed between the overlaying portion and the one other end portion.

22. A magnetic memory, comprising a plurality of the magnetic memory devices,
each of the magnetic memory devices including a plurality of magnetic memory elements,
each of the magnetic memory elements including:
a magnetic wire including a plurality of domain walls and a plurality of magnetic domains separated by the domain walls, the magnetic wire being a closed loop;
a stress application unit configured to cause the domain walls to circle around along the closed loop a plurality of times by applying stress to the magnetic wire; and
a recording/reproducing unit configured to write memory information by changing magnetizations of the circling magnetic domains as the domain walls circle around and to read the written memory information by detecting the magnetizations of the circling magnetic domains.

23. A magnetic memory, comprising a plurality of the magnetic memory devices,
- each of the magnetic memory devices including a plurality of magnetic memory elements,
- each of the magnetic memory elements including:
  - a magnetic wire including a plurality of domain walls and a plurality of magnetic domains separated by the domain walls, the magnetic wire being a closed loop;
  - a stress application unit configured to cause the domain walls to circle around along the closed loop a plurality of times by applying stress to the magnetic wire;
  - a recording/reproducing unit configured to write memory information by changing magnetizations of the circling magnetic domains as the domain walls circle around and read the written memory information by detecting the magnetizations of the circling magnetic domains;
  - a first electrode; and
  - a second electrode,
  - the magnetic wire including:
    - a high conductivity magnetic portion having one end portion and one other end portion, the high conductivity magnetic portion extending along one portion of the closed loop between the one end portion and the one other end portion; and
    - a low conductivity magnetic portion extending along one other portion of the closed loop to connect the one end portion to the one other end portion, a conductivity of the low conductivity magnetic portion being lower than a conductivity of the high conductivity magnetic portion, the stress being applied to the low conductivity magnetic portion by the stress application unit,
- the first electrode being electrically connected to the one end portion,
- the second electrode being electrically connected to the one other end portion,
- the one end portion having a portion overlaying the one other end portion,
- the low conductivity magnetic portion being disposed between the overlaying portion and the one other end portion.

* * * * *